United States Patent
Dutta et al.

(10) Patent No.: US 9,679,852 B2
(45) Date of Patent: Jun. 13, 2017

(54) SEMICONDUCTOR CONSTRUCTIONS

(71) Applicant: Micron Technology, Inc., Boise, ID (US)

(72) Inventors: Ashim Dutta, Boise, ID (US); Mohd Kamran Akhtar, Boise, ID (US); Shane J. Trapp, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 213 days.

(21) Appl. No.: 14/321,466

(22) Filed: Jul. 1, 2014

(65) Prior Publication Data

US 2016/0005693 A1    Jan. 7, 2016

(51) Int. Cl.
*H01L 23/482* (2006.01)
*H01L 23/532* (2006.01)
(Continued)

(52) U.S. Cl.
CPC .... *H01L 23/53295* (2013.01); *H01L 21/7682* (2013.01); *H01L 21/76807* (2013.01);
(Continued)

(58) Field of Classification Search
CPC ............. H01L 21/7682; H01L 23/5222; H01L 21/76831; H01L 21/76802; H01L 21/76807; H01L 21/76808; H01L 2221/1063; H01L 23/5226; H01L 21/764; H01L 21/76843; H01L 23/528; H01L 23/4821

See application file for complete search history.

(56) References Cited

U.S. PATENT DOCUMENTS 5,461,003 A * 10/1995 Havemann ........ H01L 21/02126
257/E21.581
6,177,329 B1 * 1/2001 Pang .................... H01L 21/764
257/E21.573

(Continued)

OTHER PUBLICATIONS

Beyer, "Air gaps for interconnects: ready to go?", Solid State Technology, vol. 53(6), Jun. 2010. Abstract Only.

(Continued)

*Primary Examiner* — Bac Au
(74) *Attorney, Agent, or Firm* — Wells St. John P.S.

(57) ABSTRACT

Some embodiments include a construction having conductive structures spaced from one another by intervening regions. Insulative structures are within the intervening regions. The insulative structures include dielectric spacers and air gaps between the dielectric spacers. Dielectric capping material is over the air gaps. The dielectric capping material is between the dielectric spacers and not over upper surfaces of the dielectric spacers. Some embodiments include a construction having a first conductive structure with an upper surface, and having a plurality of second conductive structures electrically coupled with the upper surface of the first conductive structure and spaced from one another by intervening regions. Air gap/spacer insulative structures are within the intervening regions. The air gap/spacer insulative structures have dielectric spacers along sidewalls of the second conductive structures and air gaps between the dielectric spacers. Dielectric capping material is over the air gaps.

7 Claims, 16 Drawing Sheets

(51) Int. Cl.
*H01L 23/522* (2006.01)
*H01L 21/768* (2006.01)

(52) U.S. Cl.
CPC .... *H01L 21/76831* (2013.01); *H01L 23/5222* (2013.01); *H01L 21/76829* (2013.01); *H01L 21/76834* (2013.01); *H01L 2221/1031* (2013.01); *H01L 2924/0002* (2013.01)

(56) References Cited

U.S. PATENT DOCUMENTS

| | | | | |
|---|---|---|---|---|
| 6,211,561 | B1* | 4/2001 | Zhao | H01L 21/7682 257/522 |
| 6,228,770 | B1* | 5/2001 | Pradeep | H01L 21/7682 216/38 |
| 6,413,852 | B1* | 7/2002 | Grill | H01L 21/7682 257/E21.576 |
| 6,555,467 | B2* | 4/2003 | Hsu | H01L 21/76811 257/E21.579 |
| 6,867,125 | B2 | 3/2005 | Kloster et al. | |
| 6,909,128 | B2 | 6/2005 | Ireland | |
| 6,917,109 | B2 | 7/2005 | Lur et al. | |
| 7,094,669 | B2 | 8/2006 | Bu et al. | |
| 7,112,866 | B2* | 9/2006 | Chan | H01L 21/7682 257/522 |
| 7,361,991 | B2* | 4/2008 | Saenger | H01L 21/76807 257/552 |
| 7,449,407 | B2 | 11/2008 | Lur et al. | |
| 7,602,038 | B2* | 10/2009 | Zhu | H01L 21/7682 257/522 |
| 7,671,442 | B2 | 3/2010 | Anderson et al. | |
| 7,868,455 | B2* | 1/2011 | Chen | H01L 21/76807 257/750 |
| 7,871,923 | B2* | 1/2011 | Liu | H01L 21/76807 438/622 |
| 7,879,683 | B2* | 2/2011 | Al-Bayati | H01L 21/3105 257/E21.573 |
| 7,973,409 | B2* | 7/2011 | Yang | H01L 21/7682 257/751 |
| 8,264,060 | B2* | 9/2012 | Braeckelmann | H01L 21/7682 257/522 |
| 8,298,911 | B2* | 10/2012 | Lee | H01L 21/7682 257/758 |
| 8,900,988 | B2* | 12/2014 | Lin | H01L 21/31127 257/E21.581 |
| 8,940,632 | B2* | 1/2015 | Nam | H01L 21/76831 438/619 |
| 9,159,609 | B2* | 10/2015 | Lee | H01L 21/76855 |
| 9,293,362 | B2* | 3/2016 | Lee | H01L 21/7682 |
| 2002/0158337 | A1* | 10/2002 | Babich | H01L 21/7681 257/758 |
| 2003/0064581 | A1 | 4/2003 | Pan et al. | |
| 2004/0094821 | A1 | 5/2004 | Lur et al. | |
| 2004/0232552 | A1 | 11/2004 | Wang et al. | |
| 2004/0266167 | A1* | 12/2004 | Dubin | H01L 21/7682 438/619 |
| 2005/0012219 | A1* | 1/2005 | Liou | H01L 21/76807 257/758 |
| 2011/0210448 | A1 | 9/2011 | Nitta et al. | |
| 2015/0076705 | A1* | 3/2015 | Singh | H01L 23/481 257/774 |
| 2015/0243544 | A1* | 8/2015 | Alptekin | H01L 21/7682 438/586 |

OTHER PUBLICATIONS

Harada et al., "Extremely Low Keff (1.9) Cu Interconnects with Air Gap Formed Using SiOC," IEEE, International Interconnect Technology Conference, Burlingame, CA, Jun. 4-6, 2007, pp. 141-143. Abstract Only.

Hoofman et al., "Alternatives to low-k nanoporous materials: dielectric air-gap integration," Solid State Technology, Aug. 2006, pp. 55-58.

Korczynski, "Intel shows vertical integration pays off with air-gaps," BetaBlog, Wednesday, Jun. 16, 2010 entry. Retrived May 14, 2014 from http://www.betasights.net/wordpress/?p=1018.

Pantouvaki et al., "Air-gap formation by UV-assisted decomposition of CVD material," Microelectronic Engineering, vol. 85, Issue 10, Oct. 2008, pp. 2071-2074.

Park et al., "Air-Gaps for High-Performance On-Chip Interconnect Part II: Modeling, Fabrication, and Characterization", Journal of Electronic Materials, vol. 37(10), 2008, pp. 1534-1546.

* cited by examiner

SEMICONDUCTOR CONSTRUCTIONS

TECHNICAL FIELD

Semiconductor constructions, such as, for example, semiconductor constructions having insulative material within intervening regions between spaced-apart conductive structures.

BACKGROUND

Integrated circuitry may comprise conductive structures separated from one another by intervening insulative structures. The insulative structures may be characterized in terms of one or more of various parameters; such as, for example, dielectric constant, breakdown threshold, leakage current, etc.

There is a continuing goal to develop improved insulative structures for existing integrated circuitry, as well as a goal to develop insulative structures that may be suitable for future integrated circuitry.

Air gaps have been utilized in insulative structures, and may provide advantages relative to other insulative materials. However, difficulties are encountered in controlling air gap size and shape. Such difficulties can lead to challenges in tailoring air gap dimensions for particular applications, and in uniformly forming air gaps across numerous structures during semiconductor fabrication.

DETAILED DESCRIPTION OF THE ILLUSTRATED EMBODIMENTS

Some embodiments include semiconductor constructions having air gap/spacer insulative structures between conductive structures, and some embodiments include methods of forming air gap/spacer insulative structures. Example constructions are described with reference to FIGS. 1-6; and example methods are described with reference to FIGS. 7-35.

Figure 1:
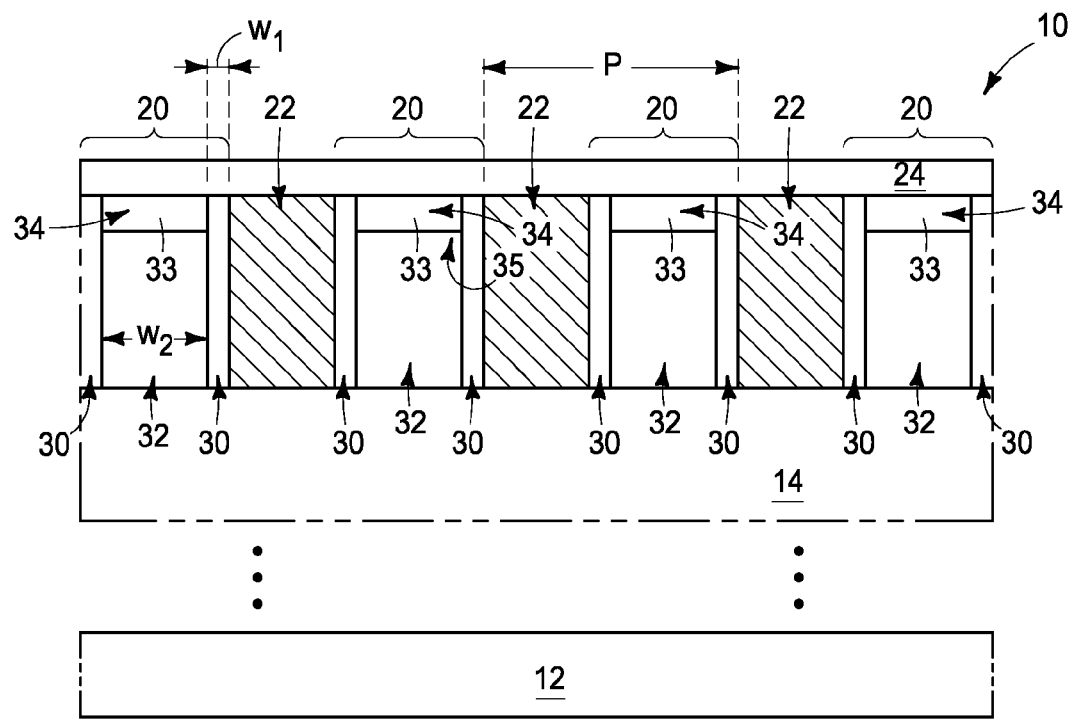
FIGS. 1 and 2 are a diagrammatic cross-sectional side view, and a top view, respectively of a region of an example embodiment construction. The cross-section of FIG. 1 is along the line 1-1 of FIG. 2.
Figure 2:
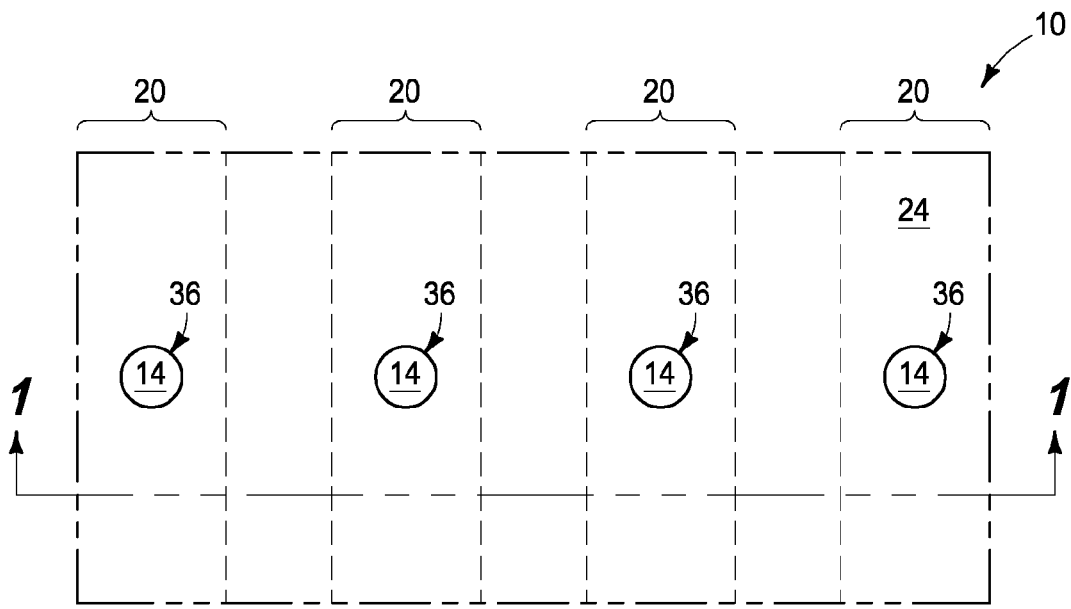

FIGS. 1 and 2 illustrate a semiconductor construction 10 having example air gap/spacer insulative structures 20. Such insulative structures are shown being utilized for electrically separating conductive structures 22.

The insulative structures 20 and conductive structures 22 are supported by an electrically insulative material 14, which in turn is supported by a base 12. A space is provided between base 12 and insulative material 14 to indicate that there may be additional materials between the base and the insulative material.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12, over the shown region of base 12, and/or laterally adjacent the shown region of base 12; and may correspond to, for example, one or more of refractory metal materials, barrier materials, diffusion materials, insulator materials, etc.

The insulative material 14 may comprise any suitable electrically insulative composition or combination of compositions; and in some embodiments may comprise one or more of silicon dioxide, silicon nitride, borophosphosilicate glass, etc.

The electrically conductive structures 22 are representative of any of numerous integrated circuit components, including, for example, transistors, fuses, memory cells, wiring, etc. In some embodiments, structures 22 may correspond to electrically conductive lines extending in and out of the page relative to the cross-sectional FIG. 1. Such lines may correspond to, for example, access/sense lines of a memory array, wiring utilized to connect peripheral circuitry to the circuitry of a memory array, lines associate with logic, etc. In some embodiments, the structures 22 may comprise material difficult to etch, such as, for example, copper. For instance, the structures 22 may be copper-containing lines extending in and out of the page relative to the cross-section of FIG. 1. In such embodiments, the copper-containing lines may comprise a copper core and one or more copper barrier materials (for instance, tantalum, titanium nitride, ruthenium-containing materials) adjacent the core.

An insulative material 24 extends across structures 20 and 22. Material 24 may comprise any suitable composition or combination of compositions, and in some embodiments may have copper barrier properties. For instance, in some embodiments material 24 may comprise, consist essentially of, or consist of a composition containing silicon and carbon.

The insulative structures 20 comprise dielectric spacers 30 along sidewalls of conductive structures 22, and comprise air gaps 32 between the dielectric spacers.

The dielectric spacers may comprise any suitable composition or combination of compositions; and in some embodiments may comprise, consist essentially of, or consist of one or more of silicon oxide, aluminum oxide, hafnium oxide, zirconium oxide, silicon nitride, etc.

In the embodiment of FIG. 1, the dielectric spacers 30 are configured as pillars having substantially constant thickness along entireties of their heights. In other embodiments, the dielectric spacers may have other configurations.

The dielectric spacers are shown to comprise a single homogeneous composition. In other embodiments, the dielectric spacers may comprise laminates of two or more different compositions. Utilization of laminates may enable additional tailoring of dielectric properties of the structures 20. In some example embodiments, the dielectric spacers may comprise a laminate of silicon nitride and oxide; with example oxides including aluminum oxide, hafnium oxide, silicon oxide, zirconium oxide, etc.

The dielectric spacers have widths $W_1$ and the air gaps 32 have widths $W_2$. The relative widths of the air gaps and dielectric spacers, together with the composition of the dielectric spacers, may be tailored with methodology described below to customize the electrically insulative structures 20 for particular applications. In some embodiments, the width of the air gap ($W_2$) within an insulative structure 20 may be within a range of from about 10% to about 90% of a total width of the insulative structure (with the total width being $W_2+2*W_1$).

The insulative structures 20 comprise insulative capping structures 34 over the air gaps 32. The capping structures are between the dielectric spacers 30, and are not over upper surfaces of the dielectric spacers. The capping structures comprise dielectric capping material 33. Such material may be any suitable composition or combination of compositions; and in some embodiments may comprise, consist essentially of, or consist of silicon oxynitride.

In the shown embodiment, the capping structures 34 join to the dielectric spacers 30 at corners 35 having substantially right angles (i.e., being about 90°). The term "substantially right angle" is utilized to indicate that the corners are right angles to within reasonable tolerances of fabrication and measurement.

In some embodiments, the conductive structures 22 may be considered to be spaced apart from one another by intervening regions, and the insulative structures 20 may be considered to be within such intervening regions. In the shown embodiment, the insulative structures 20 fill such intervening regions.

In the embodiment of FIG. 1, the conductive structures 22 are on a uniform pitch "P". In other embodiments, the conductive structures may have other arrangements. For instance, the conductive structures may be on a non-uniform pitch (which may be an oscillating pitch in some embodiments).

FIG. 2 shows a top view of the construction 10 of FIG. 1. The insulative structures 20 are diagrammatically illustrated in phantom view to indicate that such structures are under the material 24. A plurality of openings 36 extend through materials 24 and 34, and into the air gaps 32 (FIG. 1). Such openings are utilized during removal of sacrificial material in formation of the air gaps (as described below with reference to, for example, FIG. 12). The openings are shown to be uniform, and in about the same locations of the insulative structures relative to one another. The openings may have other configurations in other embodiments (for example, some embodiments may utilize non-local exhumation, which may enable very narrow pitch (P<30 nm) structures).

Figure 3:
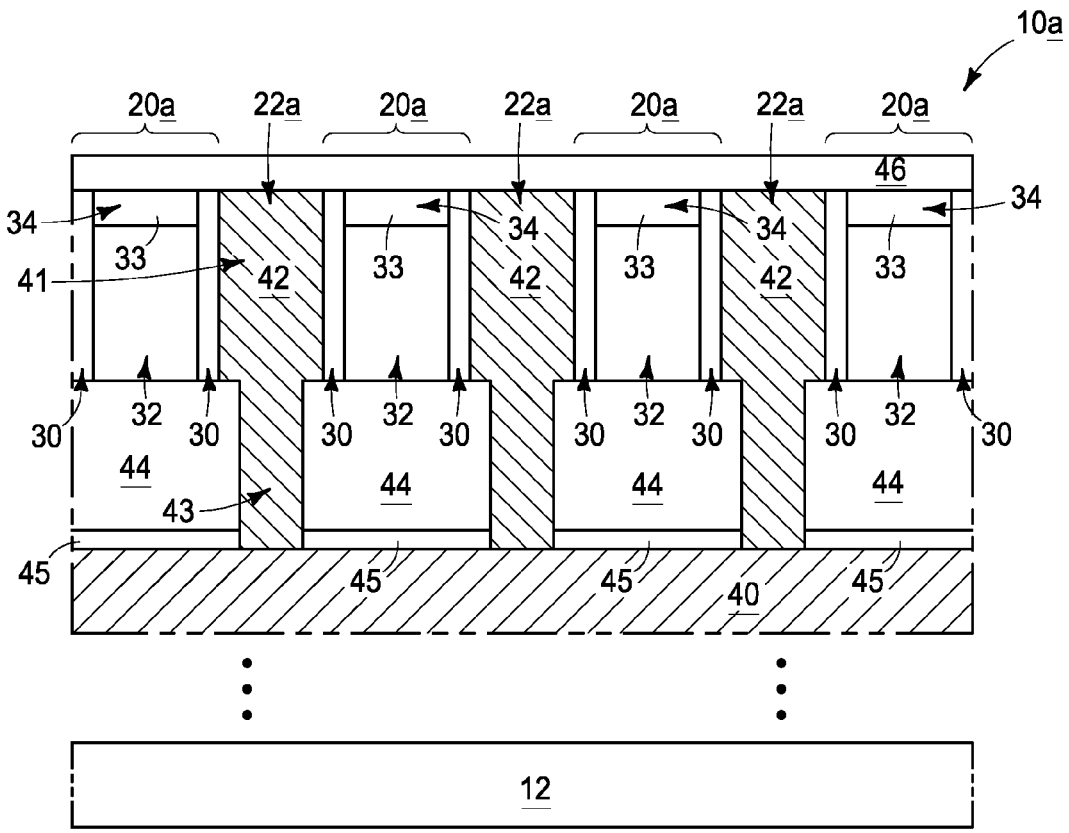
FIGS. 3 and 4 are a diagrammatic cross-sectional side view, and a top view, respectively of a region of another example embodiment construction. The cross-section of FIG. 3 is along the line 3-3 of FIG. 4.
Figure 4:
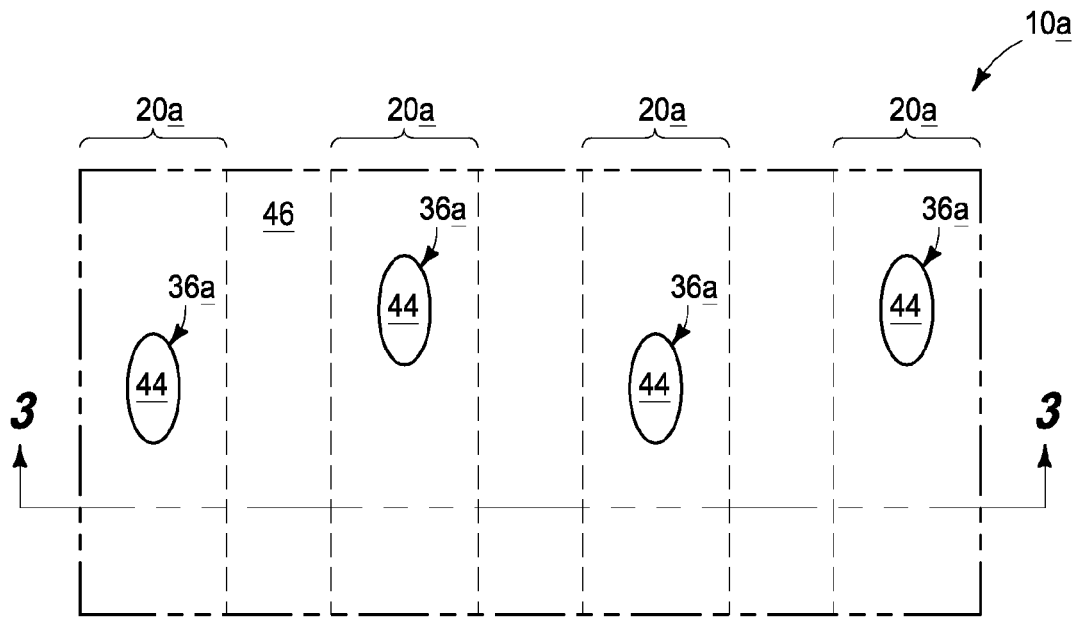

FIGS. 3 and 4 show a semiconductor construction 10a illustrating another example embodiment utilizing air gap/spacer insulative structures. In the embodiment of FIGS. 3 and 4, the air gap/spacer insulative structures are labeled 20a, and are between electrically conductive structures 22a corresponding to electrical interconnects.

The insulative structures 20a and conductive structures 22a are supported by an electrically conductive material 40, which in turn is supported by a base 12. A space is provided between base 12 and conductive material 40 to indicate that there may be additional materials between the base and the conductive material.

The base 12 may comprise a semiconductor base of the type described above with reference to FIG. 1.

The conductive material 40 may be configured as an electrically conductive line; and may comprise any suitable composition or combination of compositions. In some embodiments, material 40 may comprise copper. In such embodiments, copper barrier material (not shown) may be provided along at least some of the peripheral surfaces of the copper to preclude diffusion of copper into adjacent materials and regions.

The interconnects 22a comprise electrically conductive material 42. Such may be any suitable material (including materials which are difficult to etch); and in some embodiments may comprise, consist essentially of, or consist of one or more of various metals (for example, copper, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). The conductive material 42 may be different than conductive material 40. For instance, in some embodiments material 42 may comprise, consist essentially of, or consist of tungsten; and material 40 may comprise copper.

In some embodiments, the material 40 may be considered to be configured into a first conductive structure, and the conductive structures 22a may be considered to be second conductive structures which are electrically coupled with the first conductive structure. In the shown embodiment, the second conductive structures directly contact an upper surface of the first conductive structure. The second conductive structures are spaced from one another by intervening regions, and such intervening regions comprise insulative structures 20a.

In the shown embodiment, the conductive interconnects 22a comprise wide upper regions 41 and narrow lower regions 43. The terms "wide" and "narrow" are utilized relative to one another so that the term "wide region" refers to a region which is wider than another region which is referred to as a "narrow region". The terms "wide" and "narrow" are only utilized to indicate relative differences between the referred-to regions, and are not utilized in an absolute sense to indicate that the regions are particularly wide or narrow relative to similar regions of conventional devices.

The conductive interconnects may be formed to have the shown lower narrow regions and upper wide regions through, for example, dual-damascene processing (example dual-damascene processing is described below with reference to FIGS. 13-27).

The embodiment of FIG. 3 shows air gap/spacer insulative structures 20a being between the wider upper regions 41 of interconnects 22a, and shows an insulative material 44 beneath the structures 20a and between the narrow lower regions 43 of the interconnects.

The insulative material 44 may comprise any suitable composition or combination of compositions; and in some embodiments may comprise one or both of silicon dioxide and silicon nitride.

In the shown embodiment, insulative material 44 is spaced from conductive material 40 by a barrier dielectric 45. Such barrier dielectric may have properties suitable to prevent diffusion of copper from a copper-containing material 40; and in some embodiments may comprise, consist essentially of, or consist of silicon carbide. In some embodiments, material 45 may be omitted; such as, for instance, if conductive material 40 does not comprise copper.

The air gap/spacer insulative structures 20a comprise the dielectric spacers 30 and capping structures 34 described above with reference to the embodiment of FIG. 1.

The embodiment of FIG. 3 comprises insulative material 46 over the structures 20a and 22a. Such insulative material may comprise any suitable composition or combination of compositions. In some embodiments, the material 46 may comprise one or more of silicon dioxide, silicon nitride, aluminum oxide, hafnium oxide, zirconium oxide, etc.

FIG. 4 shows a top view of the construction 10a of FIG. 3. The insulative structures 20a are diagrammatically illustrated in phantom view to indicate that such structures are under the material 46. A plurality of openings 36a extend through materials 46 and 34, and into the air gaps 32 (FIG. 3). Such openings are utilized during removal of sacrificial material in formation of the air gaps (as described below with reference to, for example, FIGS. 20 and 27). The openings are shown to be uniform, but in different locations of the insulative structures relative to one another. The openings may have other configurations in other embodiments (for instance, may have other configurations in non-local exhumation).

Figure 5:
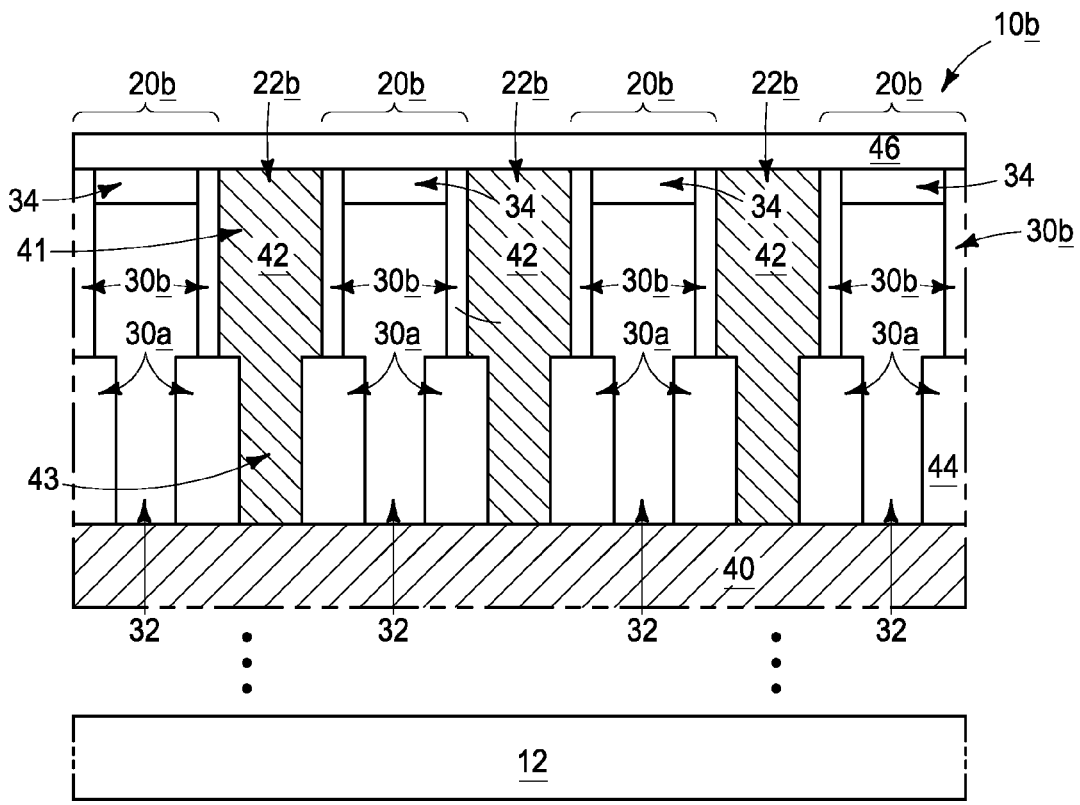
FIGS. 5 and 6 are a diagrammatic cross-sectional side view, and a top view, respectively of a region of another example embodiment construction. The cross-section of FIG. 5 is along the line 5-5 of FIG. 6.
Figure 6:
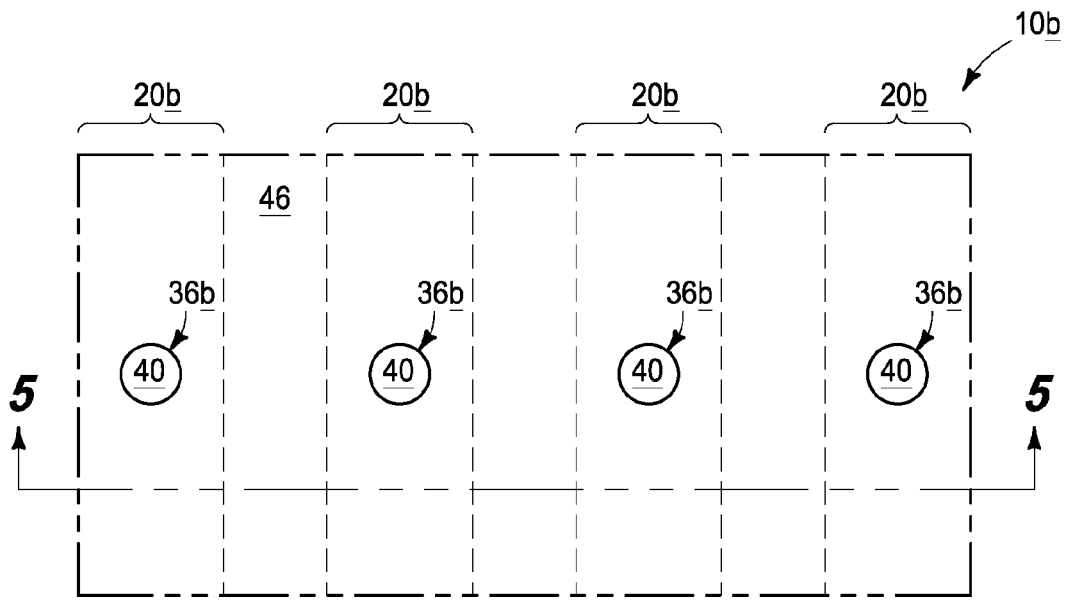

FIGS. 5 and 6 show a semiconductor construction 10b illustrating another example embodiment utilizing air gap/spacer insulative structures. In the embodiment of FIGS. 5 and 6, the air gap/spacer insulative structures are labeled 20b, and are between electrically conductive structures 22b corresponding to electrical interconnects.

The insulative structures 20b and conductive structures 22b are supported by the electrically conductive material 40 and base 12 described above with reference to other embodiments.

The interconnects 22b comprise the electrically conductive material 42 described above with reference to FIG. 3, and comprise the wide upper regions 41 and narrow lower regions 43. The conductive interconnects may be formed to have the shown lower narrow regions and upper wide regions through, for example, dual-damascene processing described below with reference to FIGS. 28-35.

The embodiment of FIG. 5 shows air gap/spacer insulative structures 22b comprising two types of dielectric spacers 30a and 30b. The dielectric spacers 30a and 30b may be referred to as first and second dielectric spacers, respectively. The first dielectric spacers 30a are wider than the second dielectric spacers 30b. The dielectric spacers 30a and 30b may comprise any of the compositions described above with reference to the dielectric spacers 30 of FIG. 1; and may each comprise only a single homogeneous composition (as shown), or one or both of the first and second dielectric structures may be a laminate of two or more compositions in other embodiments. In some embodiments, the first dielectric spacers 30a comprise one or both of silicon dioxide and silicon nitride; and the second dielectric spacers 30b comprise one or more of silicon oxide, aluminum oxide, hafnium oxide, zirconium oxide, silicon nitride, etc. The first and second dielectric spacers may comprise a same composition as one another in some embodiments, and may comprise different compositions relative to one another in other embodiments.

The first dielectric spacers 30a are between the narrow lower regions 43 of interconnects 22b, and the second dielectric spacers 30b are between the wider upper regions 41 of interconnects 22b.

The air gap/spacer insulative structures 20b comprise the capping structures 34 described above with reference to the embodiment of FIG. 1; with such capping structures joining with the second dielectric spacers 30b.

The embodiment of FIG. 5 comprises the material 46 over the structures 20b and 22b, and such material may comprise the compositions described above with reference to FIG. 3.

FIG. 6 shows a top view of the construction 10b of FIG. 5. The insulative structures 20b are diagrammatically illustrated in phantom view to indicate that such structures are under the material 46. A plurality of openings 36b extend through materials 46 and 34, and into the air gaps 32 (FIG. 5). Such openings are utilized during removal of sacrificial material in formation of the air gaps (as described below with reference to, for example, FIG. 35). The openings are shown to be uniform, and in common locations of the insulative structures relative to one another. In other embodiments, the openings may have other configurations, (for instance, may have other configurations in non-local exhumation).

The constructions of FIGS. 1-6 may be formed with any suitable methods. Some example methods are described with reference to FIGS. 7-35. The base 12 is not shown in FIGS. 7-35, but would be present.

Figure 7:
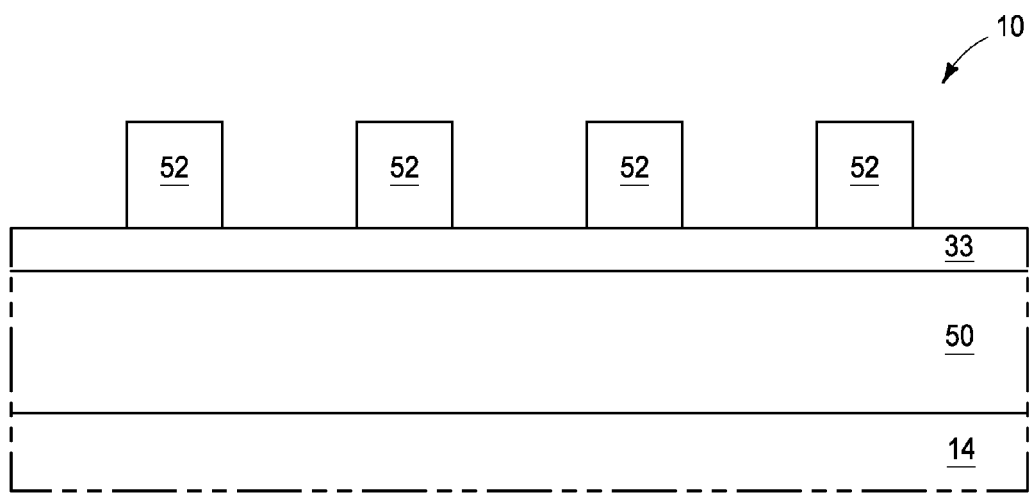
FIGS. 7-12 are diagrammatic cross-sectional side views of a construction at process stages of an example embodiment method.

Referring to FIG. 7, a construction 10 is shown at a processing stage in accordance with an example method of forming the embodiment of FIGS. 1 and 2.

The construction of FIG. 7 comprises insulative material 14, a sacrificial material 50 over material 14, and capping material 33 over the material 50. Additionally, the construction comprises a patterned masking material 52 over material 33.

The sacrificial material 50 may comprise any suitable composition or combination of compositions; and in some embodiments may comprise, consist essentially of, or consist of carbon.

The masking material 52 may comprise any suitable composition or combination of compositions; and in some embodiments may comprise photolithographically-patterned photoresist and/or masking material patterned utilizing pitch-multiplication methodologies.

Figure 8:
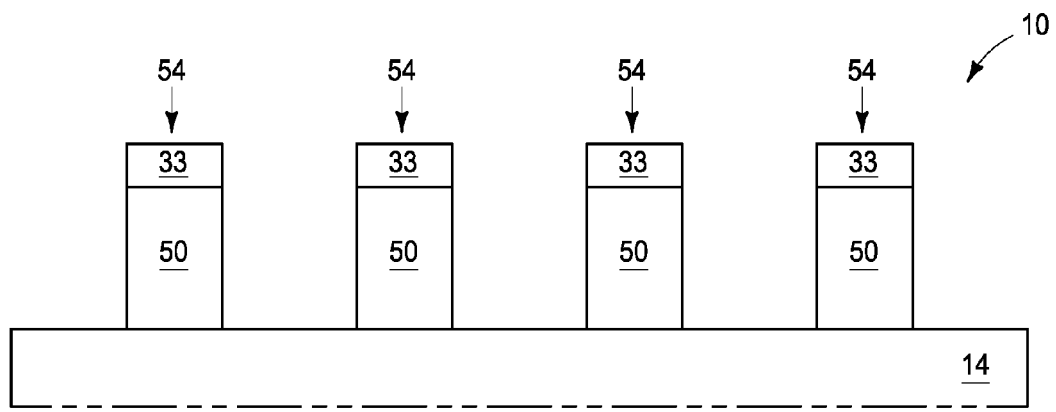

Referring to FIG. 8, a pattern is transferred from masking material 52 (FIG. 7) into materials 50 and 33, and subsequently the masking material is removed. The materials 50 and 33 are thus patterned into a plurality of pillars 54.

Figure 9:
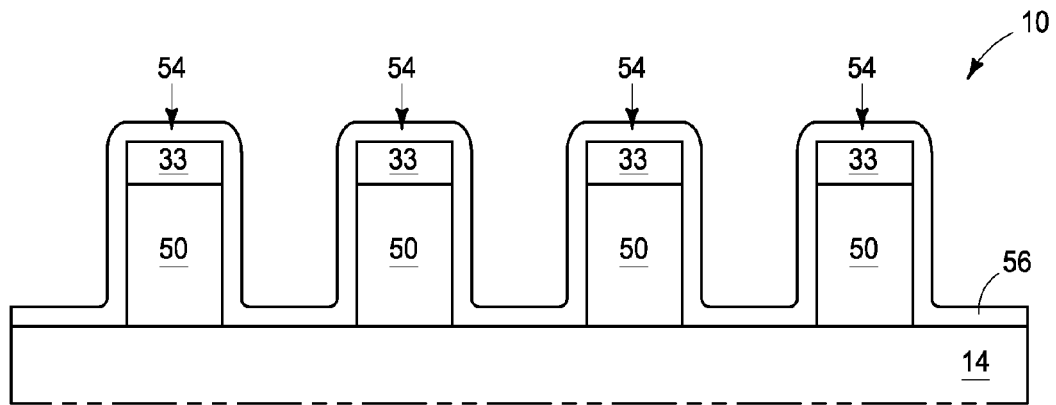

Referring to FIG. 9, dielectric material 56 is deposited over and between the pillars 54. The dielectric material 56 is eventually patterned into dielectric spacers 30, and thus may comprise any of the compositions described above as being suitable for utilization in such dielectric spacers.

Figure 10:
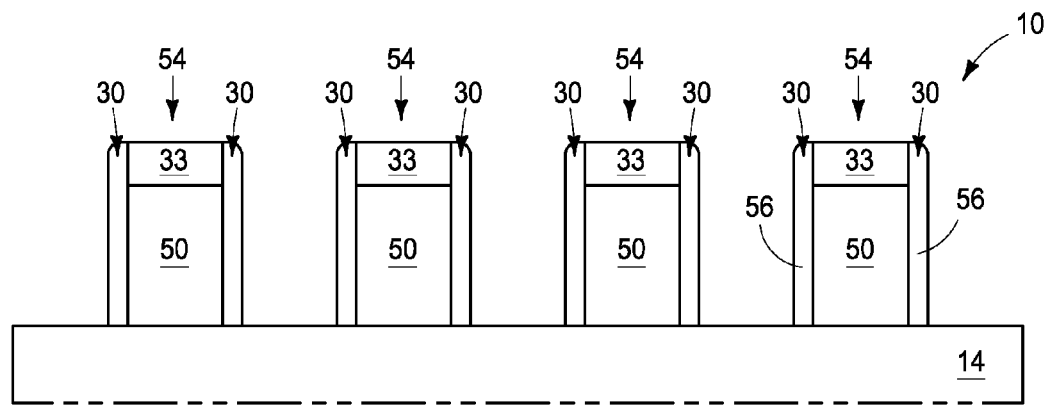

Referring to FIG. 10, the material 56 is patterned into dielectric spacers 30 utilizing an anisotropic etch.

Figure 11:
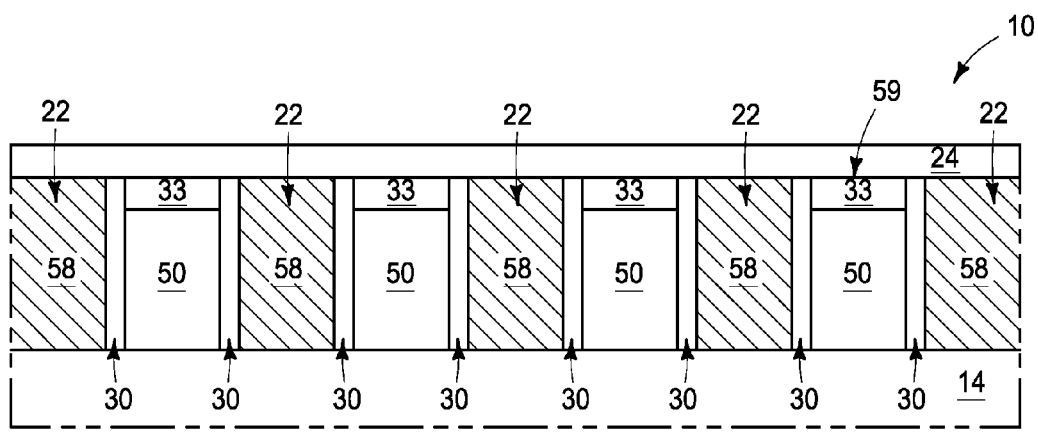

Referring to FIG. 11, conductive material 58 is deposited over and between the pillars 54 (FIG. 10), and then subjected to planarization (for instance, chemical-mechanical planarization) to pattern the conductive material into conductive structures 22 and form a planarized surface 59. The processing of FIGS. 10 and 11 thus forms the structures 22 utilizing a damascene-type process.

The insulative material 24 is formed across planarized surface 59.

Figure 12:
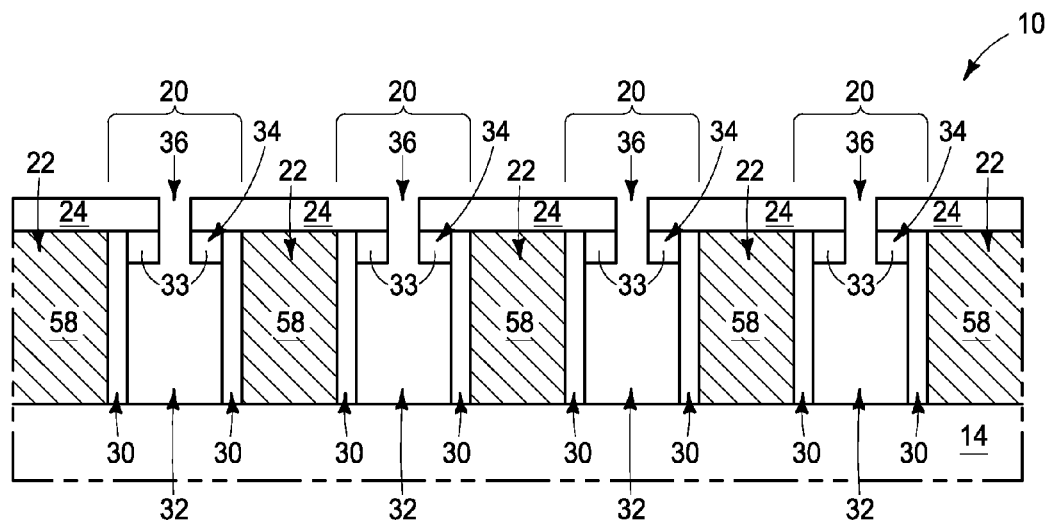

Referring to FIG. 12, openings 36 are formed to extend through materials 33 and 24, and subsequently sacrificial material 50 (FIG. 11) is removed to leave air gaps 32. The sacrificial material may be removed with any suitable processing. In embodiments in which the sacrificial material comprises carbon, such removal may comprise oxidation.

The construction of FIG. 12 is similar to that of FIG. 1, with the cross-section of FIG. 12 being through openings 36. An advantage of the processing of FIGS. 7-12 is that such can enable the insulative structures 20 to be formed having dielectric spacers 30 of a desired composition, and/or having the respective thicknesses of dielectric spacers 30 and air gaps 32 tailored for customizing insulative structures 20 for particular applications. Further, the air gaps 32 can have substantially uniform sizes and configurations across all of the insulative structures 20.

Figure 13:
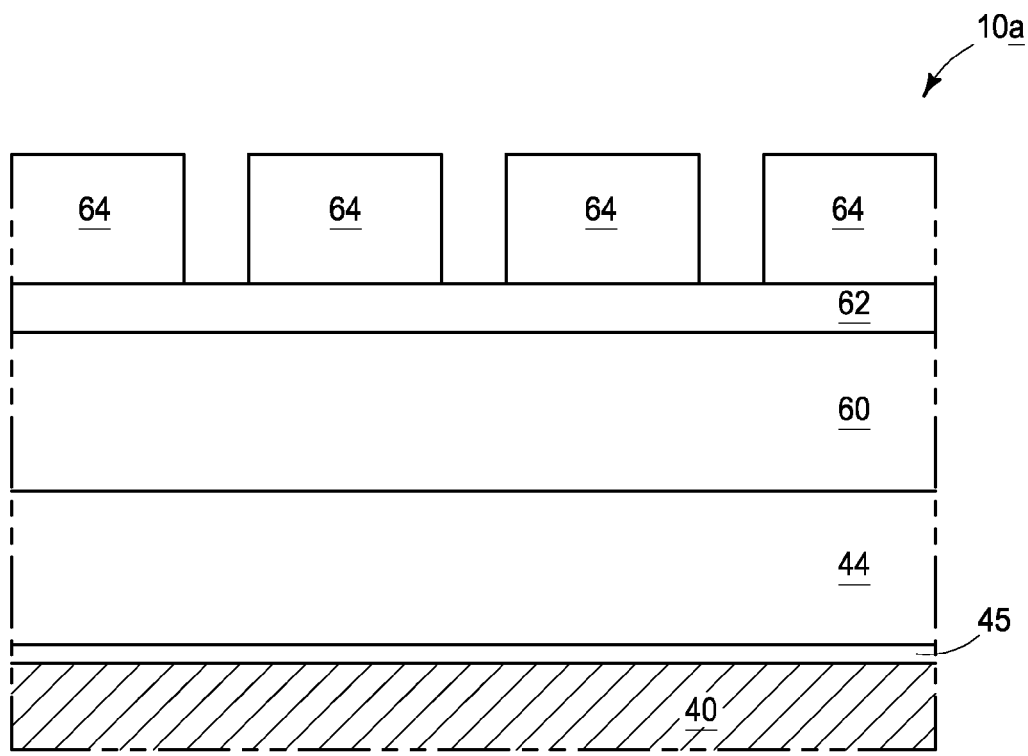
FIGS. 13-20 are diagrammatic cross-sectional side views of a construction at process stages of another example embodiment method.

Referring to FIG. 13, a construction 10*a* is shown at a processing stage in accordance with an example method of forming the embodiment of FIGS. 3 and 4.

The construction of FIG. 13 comprises conductive material 40, the barrier dielectric material 45 over material 40, insulative material 44 over the material 45, sacrificial material 60 over the insulative material 44, and a deposited antireflective coating (DARC) material 62 over the material 60. Additionally, the construction comprises a patterned masking material 64 over material 62.

The sacrificial material 60 may comprise any suitable composition or combination of compositions; and in some embodiments may comprise, consist essentially of, or consist of carbon.

The DARC material 62 may comprise any suitable composition or combination of compositions; and in some embodiments may comprise, consist essentially of, or consist of silicon oxynitride.

The masking material 64 may comprise any suitable composition or combination of compositions; and in some embodiments may comprise photolithographically-patterned photoresist and/or masking material patterned utilizing pitch-multiplication methodologies.

Figure 14:
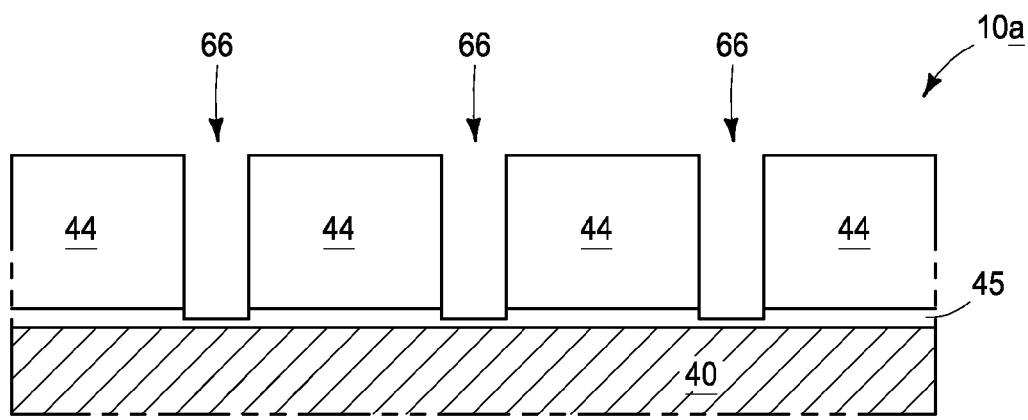

Referring to FIG. 14, a pattern is transferred from masking material 64 (FIG. 13) into underlying materials, and subsequently the masking material is removed together with materials 60 and 62 (FIG. 13). The material 44 of FIG. 14 is patterned to have openings 66 extending therein. In some example embodiments, the openings may be trenches that extend in and out of the page relative to the cross-section of FIG. 14 (or the openings may be vias, or any other suitable configuration). In the shown embodiment, the openings 66 extend partially into, but not entirely through, the barrier dielectric 45.

Figure 15:
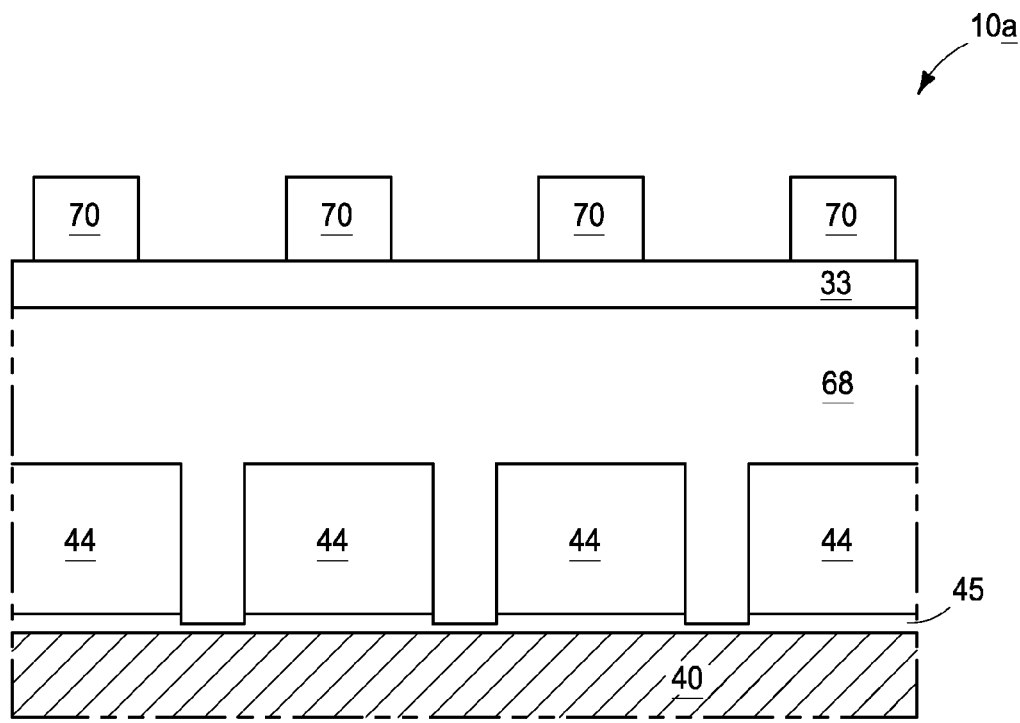

Referring to FIG. 15, sacrificial material 68 is formed over material 44 and within openings 66 (FIG. 14), capping material 33 is formed over material 68, and a patterned masking material 70 is formed over material 33.

The sacrificial material 68 may comprise any suitable composition or combination of compositions; and in some embodiments may comprise, consist essentially of, or consist of carbon.

The masking material 70 may comprise any suitable composition or combination of compositions; and in some embodiments may comprise photolithographically-patterned photoresist and/or masking material patterned utilizing pitch-multiplication methodologies.

Figure 16:
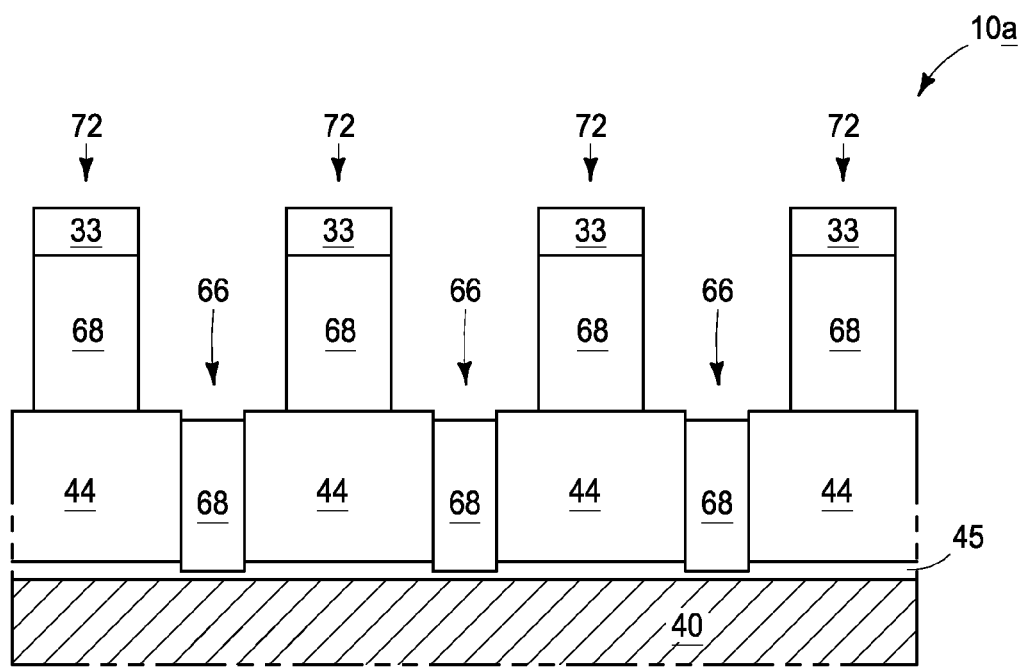

Referring to FIG. 16, a pattern is transferred from masking material 70 (FIG. 15) into materials 33 and 68, and subsequently the masking material is removed. The materials 33 and 68 are thus patterned into a plurality of pillars 72. Also, some of the material 68 remains within openings 66.

Figure 17:
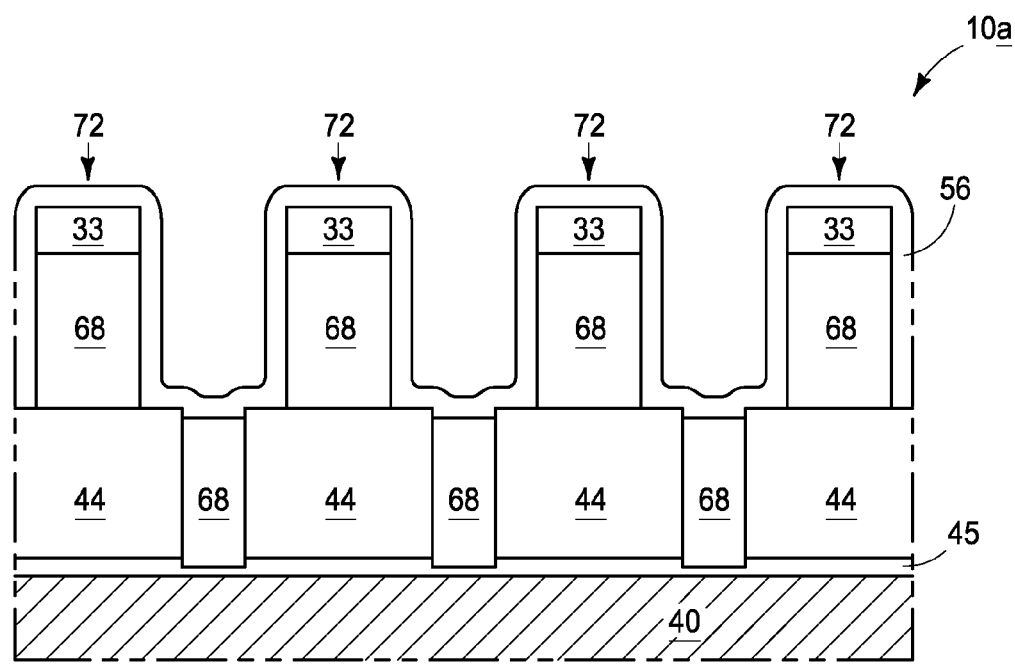

Referring to FIG. 17, dielectric material 56 is deposited over and between the pillars 72.

Figure 18:
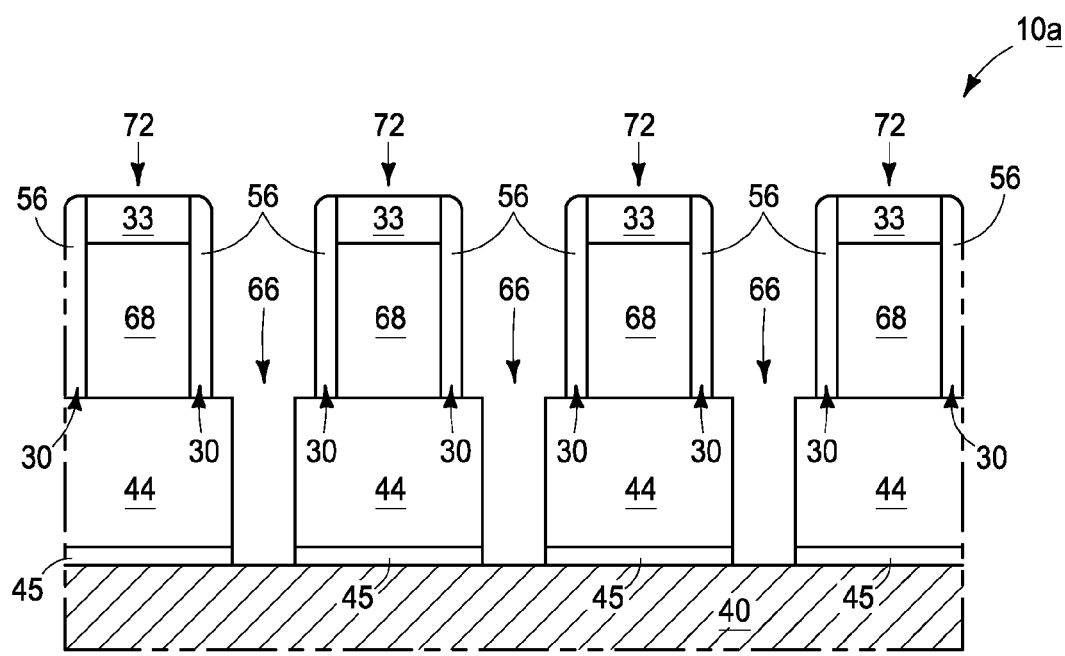

Referring to FIG. 18, dielectric material 56 is patterned into dielectric spacers 30 utilizing an anisotropic etch. After the etch of material 56, the sacrificial material 68 is removed from within openings 66 and material 45 is etched to extend the openings 66 to an upper surface of conductive material 40.

Figure 19:
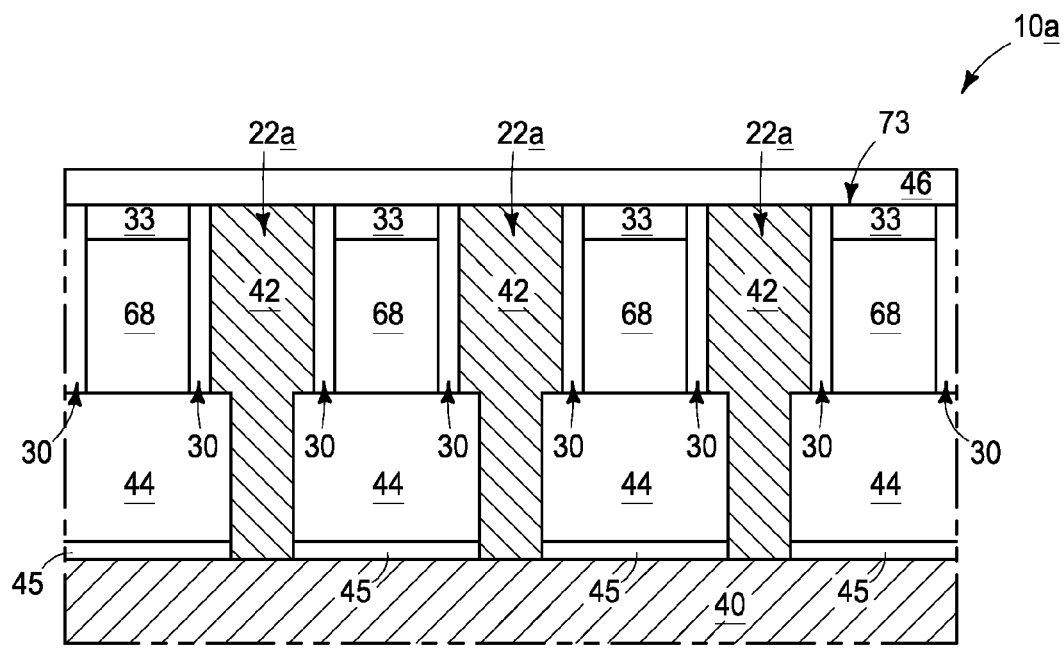

Referring to FIG. 19, conductive material 42 is deposited over and between the pillars 72 (FIG. 18), and then subjected to planarization (for instance, chemical-mechanical planarization) to pattern the conductive material into conductive structures 22*a* and form a planarized surface 73. The processing of FIGS. 13-19 thus forms the structures 22*a* utilizing a dual damascene-type process.

The insulative material 46 is formed across planarized surface 73.

Figure 20:
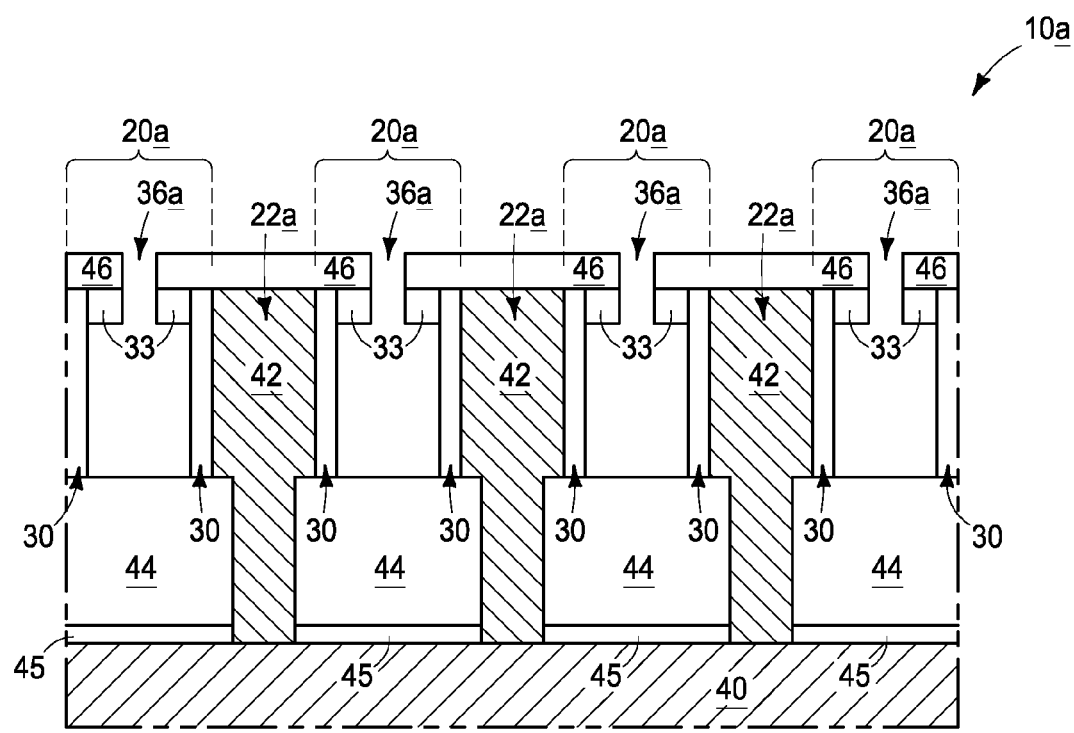

Referring to FIG. 20, openings 36*a* are formed to extend through materials 33 and 46, and subsequently sacrificial material 68 (FIG. 19) is removed to leave air gaps 32. The sacrificial material may be removed with any suitable processing. In embodiments in which the sacrificial material comprises carbon, such removal may comprise oxidation.

The construction of FIG. 20 is similar to that of FIG. 3, with the cross-section of FIG. 20 being through openings 36*a*. An advantage of the processing of FIGS. 13-20 is that such can enable the insulative structures 20*a* to be formed having dielectric spacers 30 of a desired composition, and/or having the respective thicknesses of dielectric spacers 30 and air gaps 32 tailored for customizing insulative structures 20*a* for particular applications. Further, the air gaps 32 can have substantially uniform sizes and configurations across all of the insulative structures 20*a*.

Figure 21:
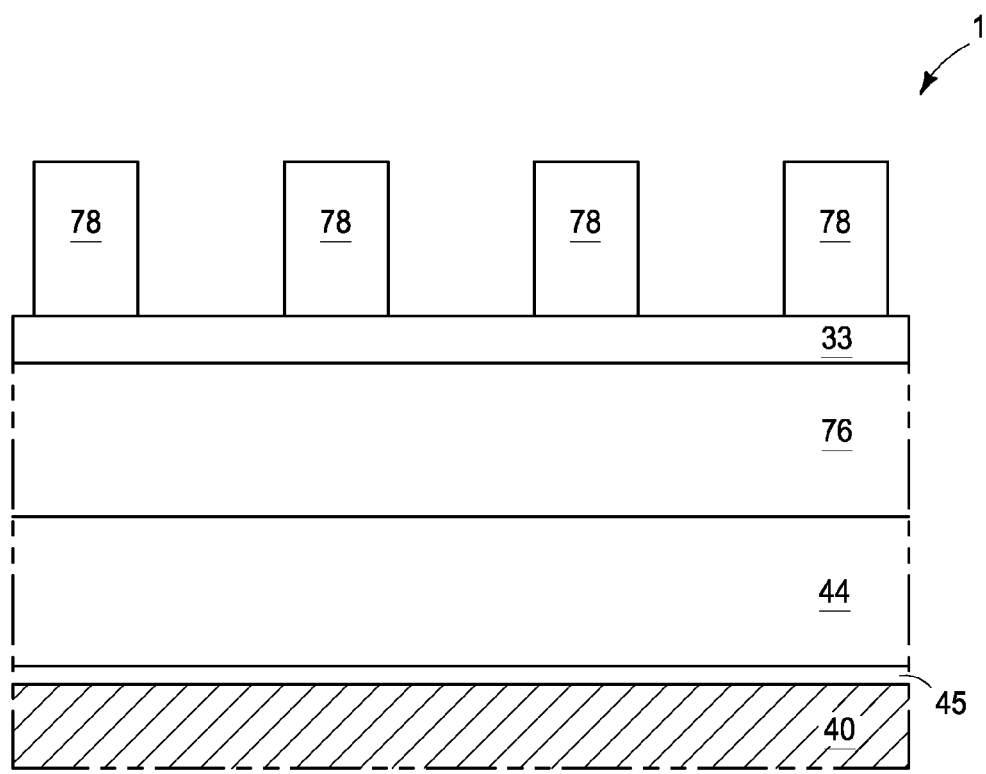
FIGS. 21-27 are diagrammatic cross-sectional side views of a construction at process stages of another example embodiment method.

Referring to FIG. 21, a construction 10*a* is shown at a processing stage in accordance with another example method of forming the embodiment of FIGS. 3 and 4.

The construction of FIG. 21 comprises conductive material 40, the barrier dielectric material 45 over material 40, insulative material 44 over the material 45, sacrificial material 76 over the insulative material 44, and capping material 33 over material 76. Additionally, the construction comprises a patterned masking material 78 over capping material 33.

The sacrificial material 76 may comprise any suitable composition or combination of compositions; and in some embodiments may comprise, consist essentially of, or consist of carbon.

The masking material 78 may comprise any suitable composition or combination of compositions; and in some embodiments may comprise photolithographically-patterned photoresist and/or masking material patterned utilizing pitch-multiplication methodologies.

Figure 22:
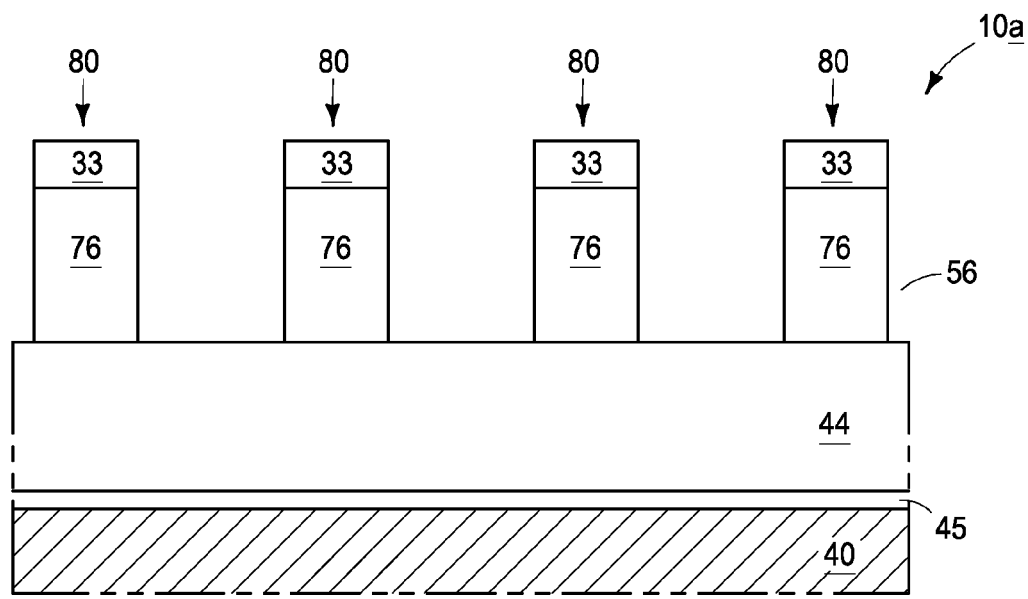

Referring to FIG. 22, a pattern is transferred from masking material 78 (FIG. 21) into materials 76 and 33, and subsequently the masking material is removed. The materials 76 and 33 are thus patterned into a plurality of pillars 80.

Figure 23:
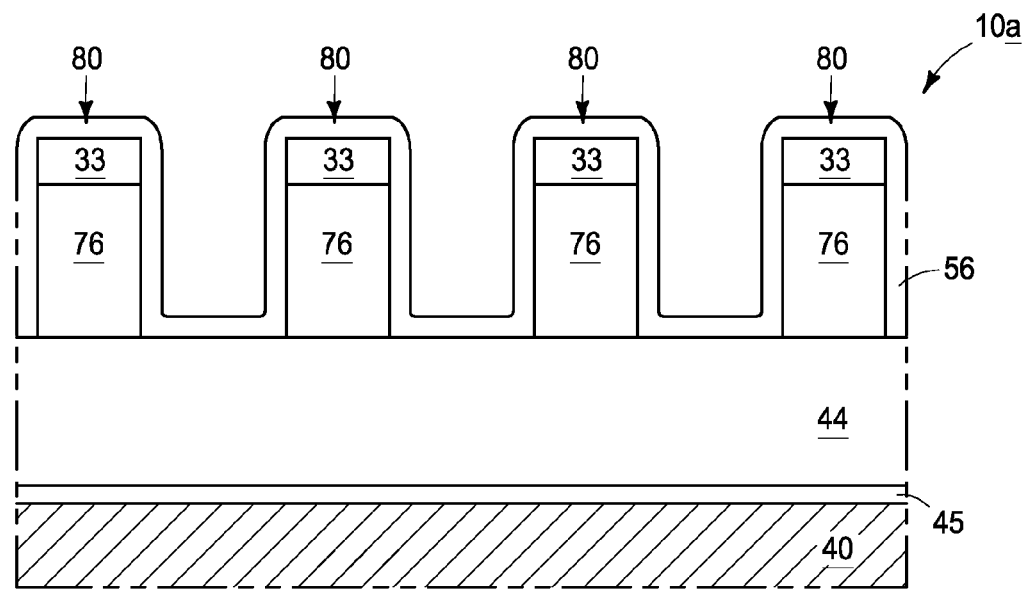

Referring to FIG. 23, dielectric material 56 is deposited over and between the pillars 80.

Figure 24:
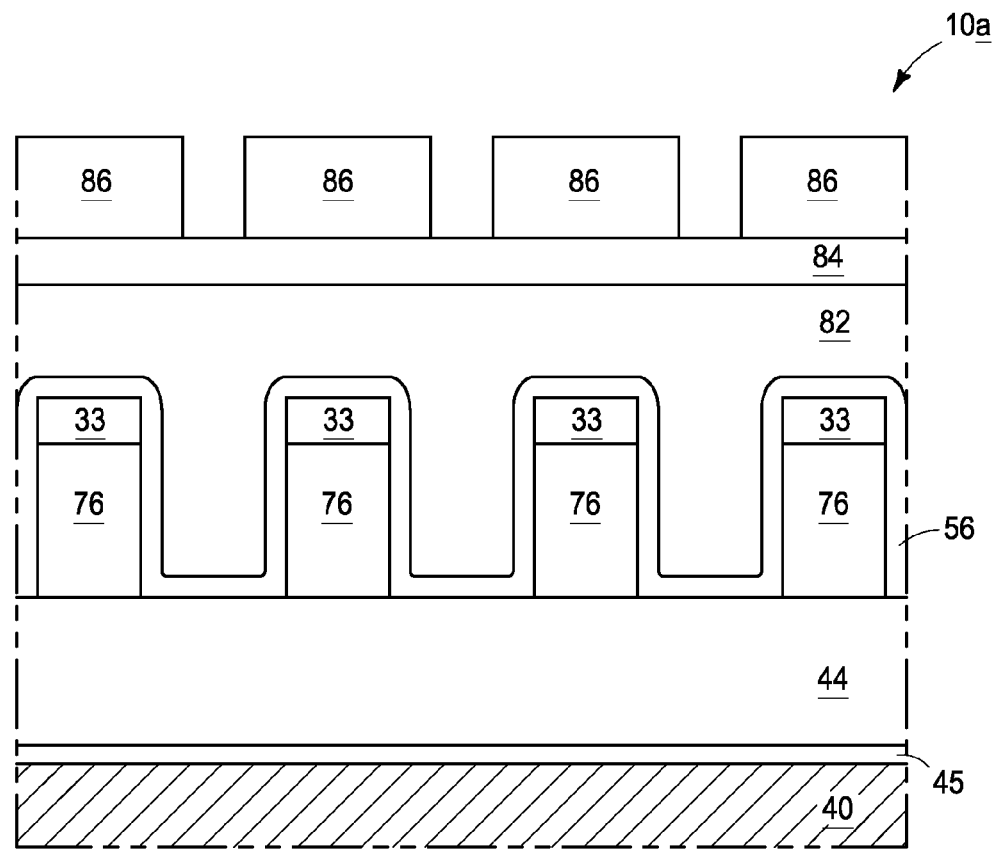

Referring to FIG. 24, a sacrificial material 82 is formed over dielectric material 56, and a DARC material 84 is formed over material 82. Additionally, a patterned masking material 86 is formed over material 84.

The sacrificial material 82 may comprise any suitable composition or combination of compositions; and in some embodiments may comprise, consist essentially of, or consist of carbon.

The masking material 86 may comprise any suitable composition or combination of compositions; and in some embodiments may comprise photolithographically-patterned photoresist and/or masking material patterned utilizing pitch-multiplication methodologies.

Figure 25:
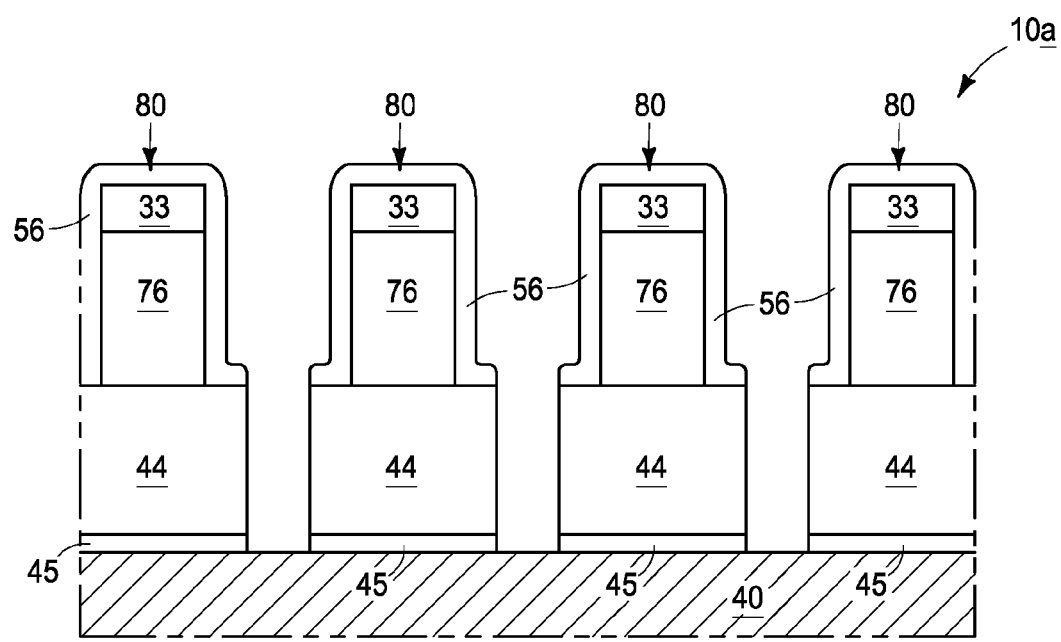

Referring to FIG. 25, a pattern is transferred from masking material 86 (FIG. 24) into underlying materials, and subsequently the masking material is removed together with materials 82 and 84 (FIG. 24).

Figure 26:
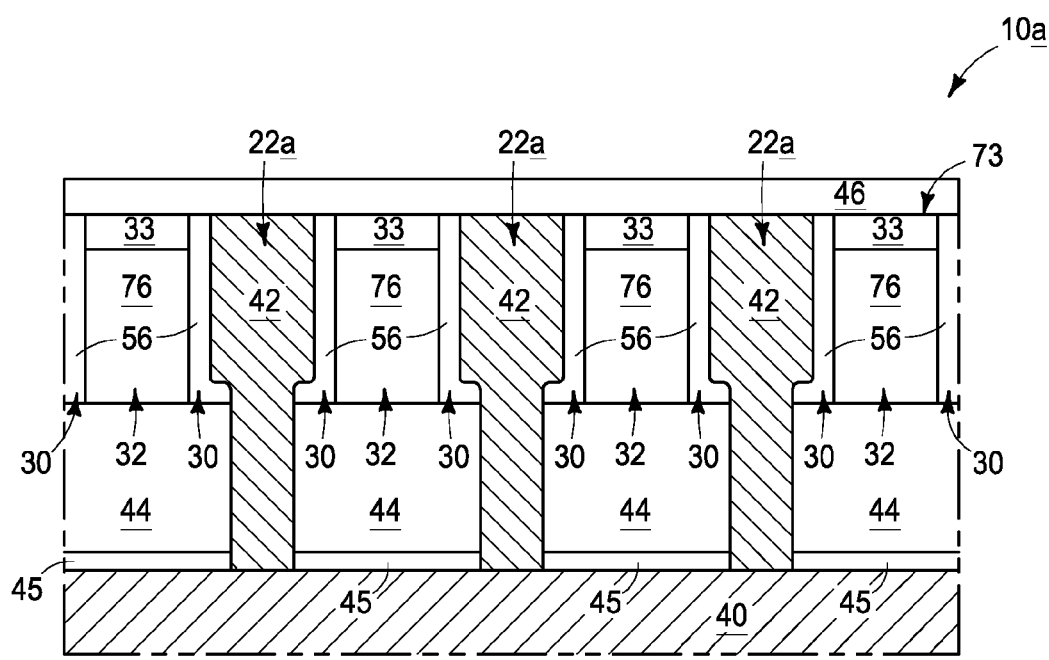

Referring to FIG. 26, conductive material 42 is deposited over and between the pillars 80 (FIG. 25), and then subjected to planarization (for instance, chemical-mechanical planarization) to pattern the conductive material into conductive structures 22a and form a planarized surface 73. The planarization also forms dielectric material 56 into dielectric spacers 30. Such spacers have a different shape than the spacers of FIG. 19, in that they have vertical portions and horizontal portions—with the horizontal portions extending along an upper surface of insulative material 44.

The insulative material 46 is formed across planarized surface 73.

Figure 27:
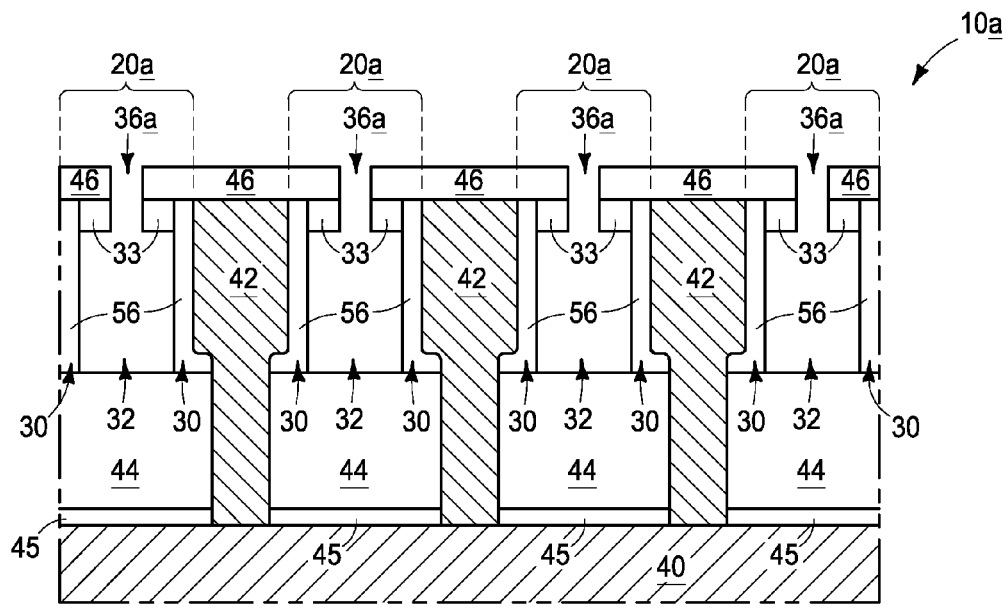

Referring to FIG. 27, openings 36a are formed to extend through materials 33 and 46, and subsequently sacrificial material 76 (FIG. 26) is removed to leave air gaps 32. The sacrificial material may be removed with any suitable processing. In embodiments in which the sacrificial material comprises carbon, such removal may comprise oxidation.

Figure 28:
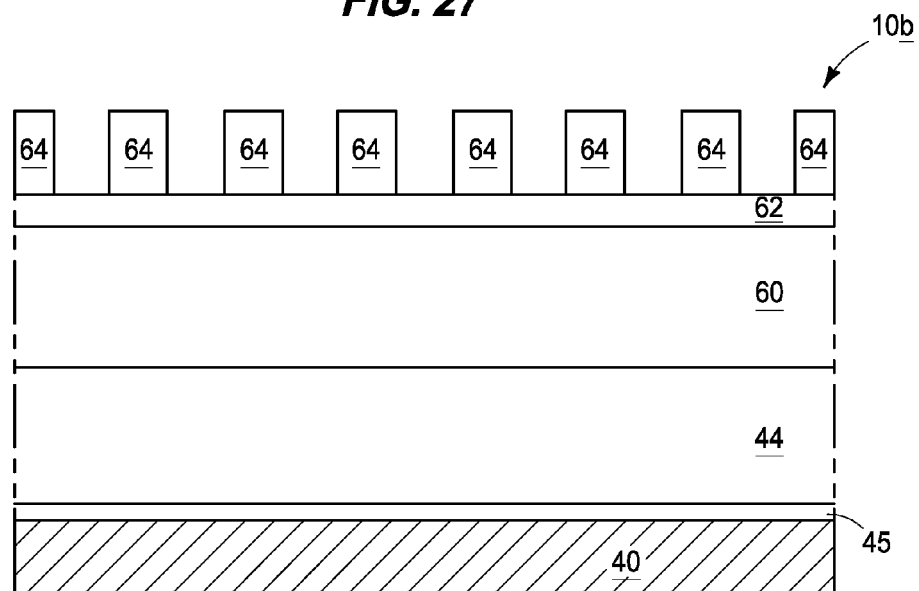
FIGS. 28-35 are diagrammatic cross-sectional side views of a construction at process stages of another example embodiment method.

Referring to FIG. 28, a construction 10b is shown at a processing stage in accordance with an example method of forming the embodiment of FIGS. 5 and 6.

The construction of FIG. 28 comprises conductive material 40, the barrier dielectric material 45 over material 40, insulative material 44 over the material 45, sacrificial material 60 over the insulative material 44, and the DARC material 62 over the material 60. Additionally, the construction comprises a patterned masking material 64 over material 62.

The construction of FIG. 28 is similar to that of FIG. 13, except that masking material 64 is patterned into a different pattern in FIG. 28 than in FIG. 13.

Figure 29:
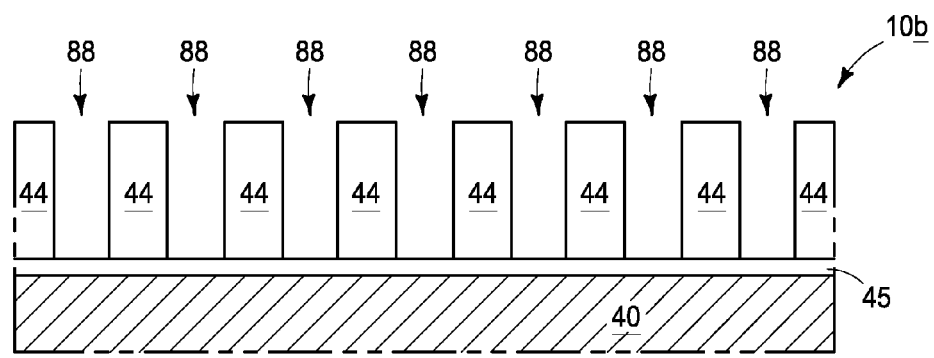

Referring to FIG. 29, a pattern is transferred from masking material 64 (FIG. 28) into underlying materials, and subsequently the masking material is removed together with materials 60 and 62 (FIG. 28). The material 44 of FIG. 29 is patterned to have openings 88 extending therein. In the shown embodiment, the openings 88 do not extend into barrier dielectric 45. In other embodiments, the openings 88 may extend partially into the barrier dielectric.

Figure 30:
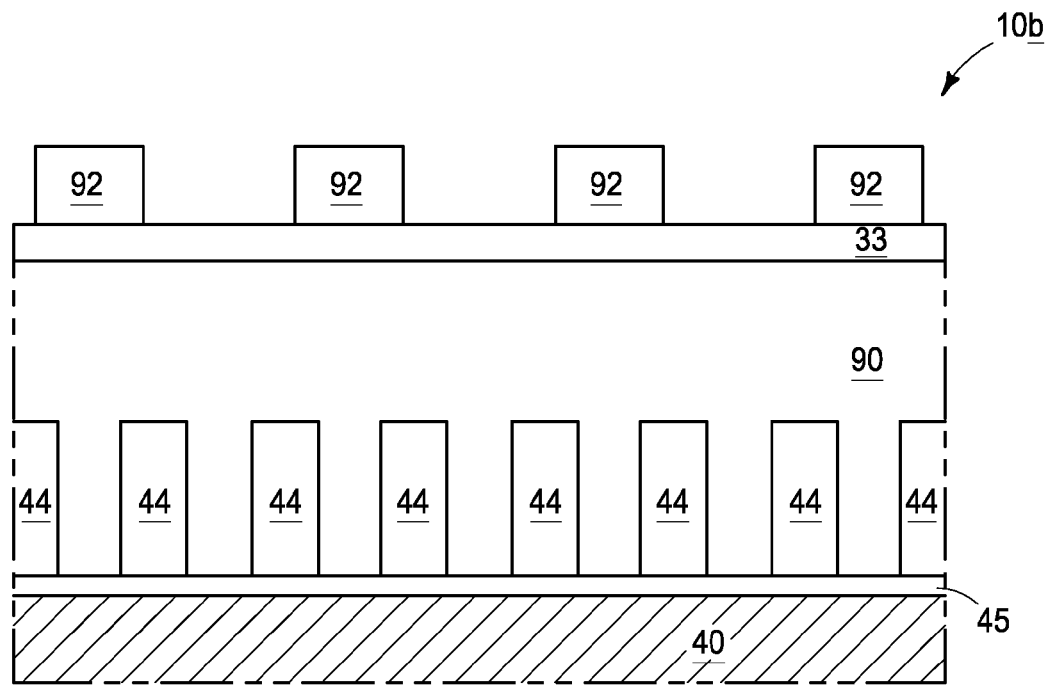

Referring to FIG. 30, sacrificial material 90 is formed over material 44 and within openings 88 (FIG. 29), capping material 33 is formed over material 90, and a patterned masking material 92 is formed over material 33.

The sacrificial material 90 may comprise any suitable composition or combination of compositions; and in some embodiments may comprise, consist essentially of, or consist of carbon.

The masking material 92 may comprise any suitable composition or combination of compositions; and in some embodiments may comprise photolithographically-patterned photoresist and/or masking material patterned utilizing pitch-multiplication methodologies.

Figure 31:
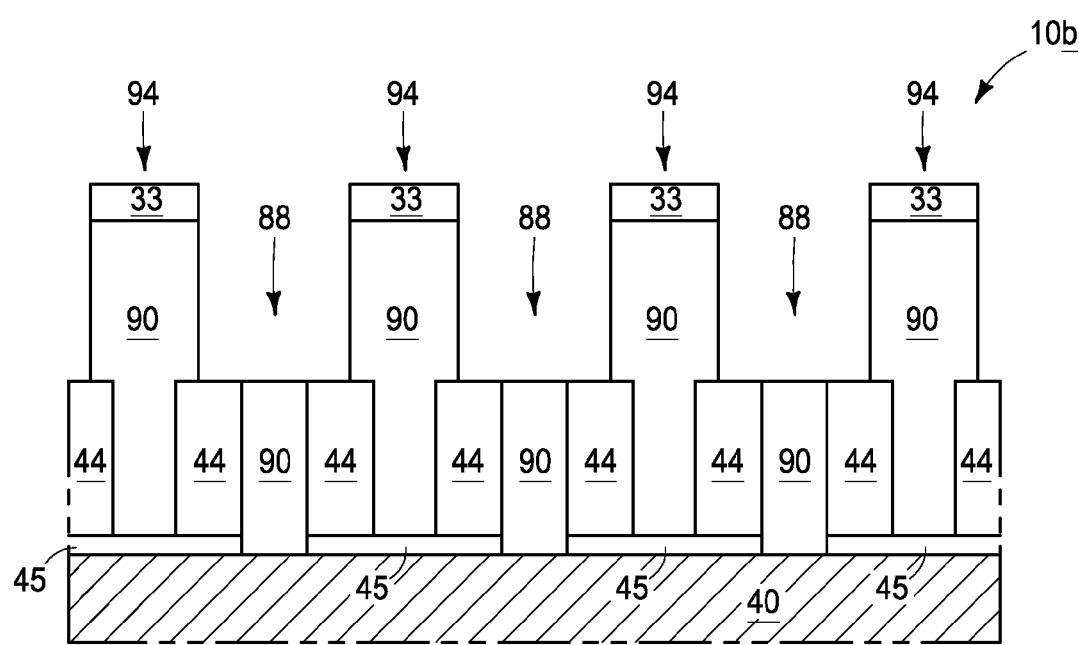

Referring to FIG. 31, a pattern is transferred from masking material 92 (FIG. 30) into materials 90 and 33, and subsequently the masking material is removed. The materials 90 and 33 are thus patterned into a plurality of pillars 94. Also, some of the material 90 remains within openings 88.

Figure 32:
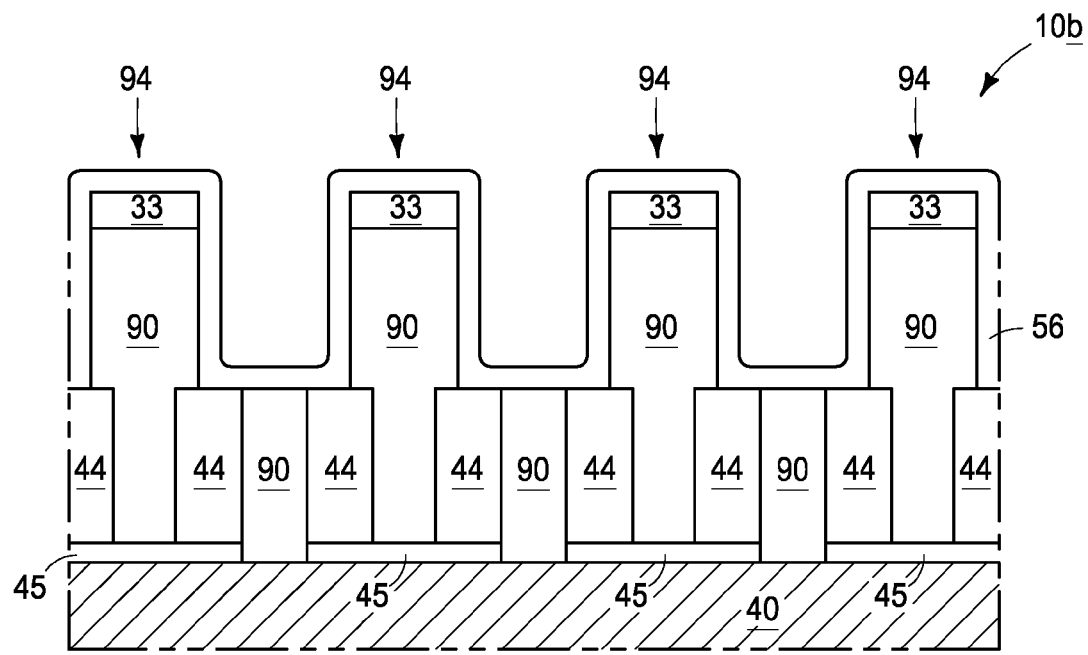

Referring to FIG. 32, dielectric material 56 is deposited over and between the pillars 94.

Figure 33:
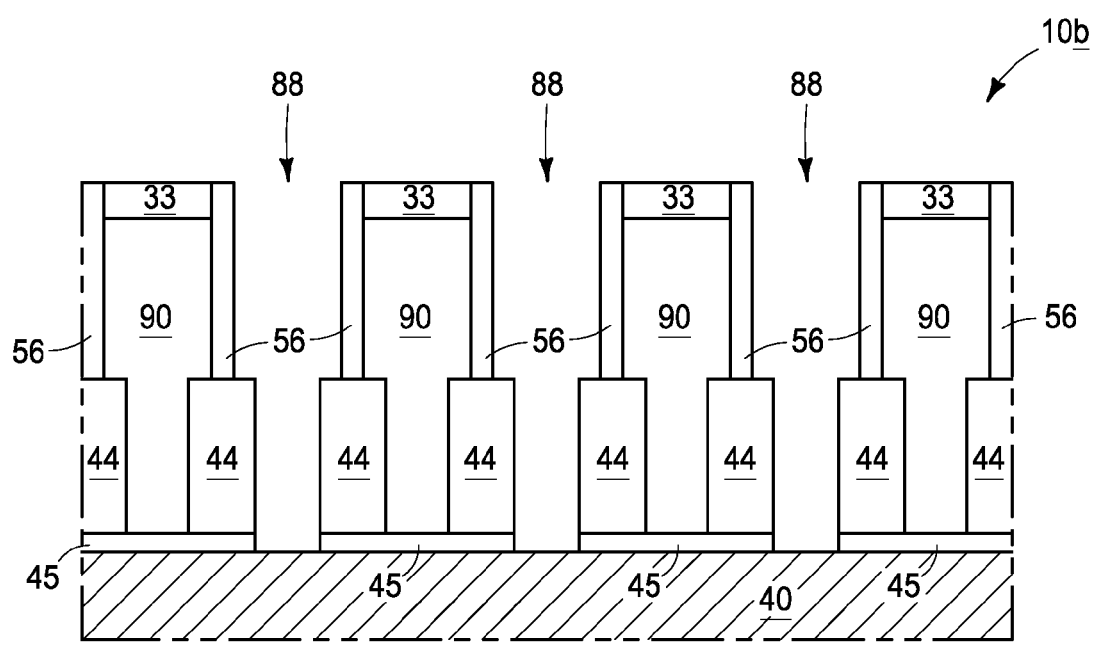

Referring to FIG. 33, dielectric material 56 is patterned into dielectric spacers utilizing an anisotropic etch. After the etch of material 56, the sacrificial material 90 is removed from within openings 88, and material 45 is etched to extend the openings 88 to an upper surface of conductive material 40.

Figure 34:
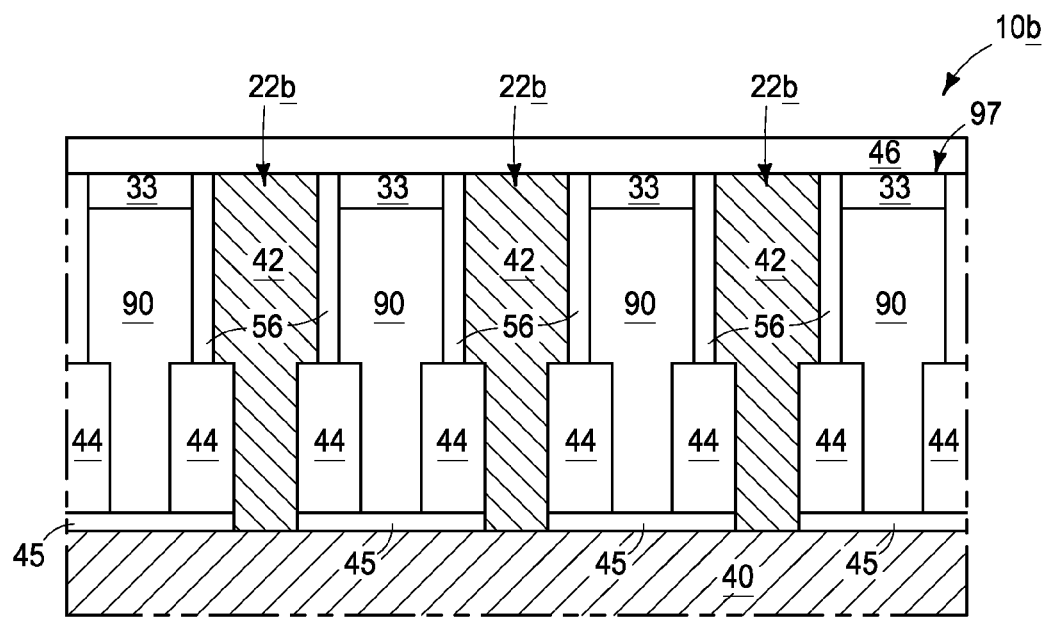

Referring to FIG. 34, conductive material 42 is deposited over and between the pillars 94 (FIG. 33), and then subjected to planarization (for instance, chemical-mechanical planarization) to pattern the conductive material into conductive structures 22b and form a planarized surface 97.

The insulative material 46 is formed across planarized surface 97.

Figure 35:
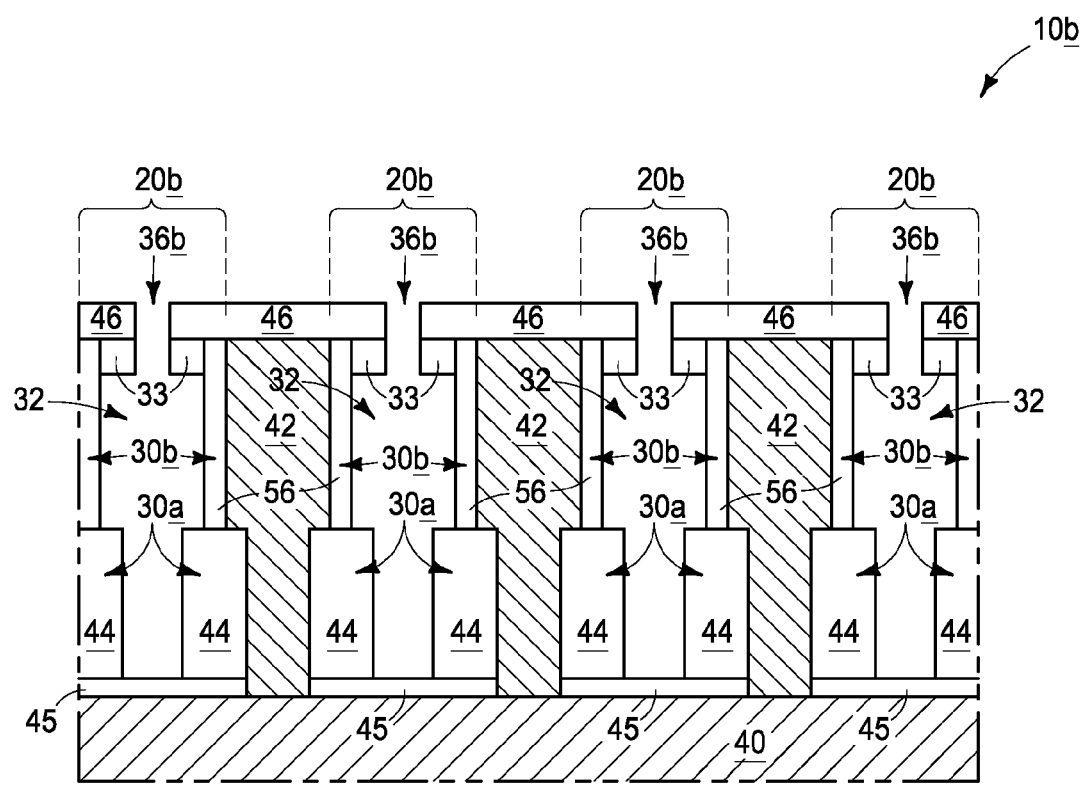

Referring to FIG. 35, openings 36b are formed to extend through materials 33 and 46, and subsequently sacrificial material 90 (FIG. 34) is removed to leave air gaps 32. The sacrificial material may be removed with any suitable processing. In embodiments in which the sacrificial material comprises carbon, such removal may comprise oxidation.

The construction of FIG. 35 is similar to that of FIG. 5, and comprises the stacked dielectric spacers 30a and 30b.

The air gap/spacer insulative structures (20, 20a and 20b) discussed above may provide numerous advantages; including, for example, enabling tailoring of dielectric properties (e.g., breakdown voltage, dielectric constant, etc.) through utilization of appropriate compositions in the spacers and/or through adjustment of relative widths of air gaps and spacers, providing structural stability to air gaps by surrounding them with dielectric, enhanced electromigration resistance of the insulative structures relative to conventional structures, etc.

The electronic devices and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a construction having conductive structures spaced from one another by intervening regions. Insulative structures are within the intervening regions. The insulative structures comprise dielectric spacers along sidewalls of the conductive structures, and comprise air gaps between the dielectric spacers. The insulative structures have dielectric capping material over the air gaps. The dielectric capping material is between the dielectric spacers and is not over upper surfaces of the dielectric spacers. The dielectric capping material comprises a different composition than the dielectric spacers.

Some embodiments include a construction having a first conductive structure with an upper surface, and having a plurality of second conductive structures electrically coupled with the upper surface of the first conductive structure and spaced from one another by intervening regions. Air gap/spacer insulative structures are within the intervening regions between the second conductive structures. The air gap/spacer insulative structures comprise dielectric spacers along sidewalls of the second conductive structures, and comprise air gaps between the dielectric spacers. Dielectric capping material is over the air gaps. The dielectric capping material is between the dielectric spacers and is not over upper surfaces of the dielectric spacers.

Some embodiments include a construction which comprises a conductive line having an upper surface, and a plurality of conductive interconnects electrically coupled with the upper surface of the conductive line and spaced from one another by intervening regions. The conductive interconnects have wide upper regions over narrow lower regions. First air gap/spacer insulative structures are within the intervening regions between the narrow lower regions of the conductive interconnects. The first air gap/spacer insulative structures comprise first dielectric spacers along sidewalls of the conductive interconnects, and comprise air gaps between the first dielectric spacers. Second air gap/spacer insulative structures are within the intervening regions between the wide upper regions of the conductive interconnects. The second air gap/spacer insulative structures comprise second dielectric spacers along sidewalls of the conductive interconnects, and comprise the air gaps between the second dielectric spacers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A construction, comprising:
    a conductive line extending lengthwise in a first direction and having an upper surface extending along the first direction;
    a plurality of conductive interconnects electrically coupled with the upper surface of the conductive line and spaced laterally from one another along the first direction by intervening regions over the conductive line; the conductive interconnects having first widths along the first direction in wide upper regions and having second widths along the first direction in narrow lower regions;
    first air gap/spacer insulative structures within the intervening regions between the narrow lower regions of the conductive interconnects, the first air gap/spacer insulative structures comprising first dielectric spacers along sidewalls of the conductive interconnects, and comprising first regions of air gaps between the first dielectric spacers; and
    second air gap/spacer insulative structures within the intervening regions between the wide upper regions of the conductive interconnects, the second air gap/spacer insulative structures comprising second dielectric spacers along sidewalls of the conductive interconnects, and comprising second regions the air gaps between the second dielectric spacers; within individual intervening regions, the second air gaps of the second air gap/spacer insulative structures merging with the first air gaps of the first air gap/spacer insulative structures with the second air gaps having a lateral width along the first direction that is greater than a lateral width of the first air gaps along the first direction.

2. The construction of claim 1 wherein the conductive line comprises a different composition than the conductive interconnects.

3. The construction of claim 2 wherein the conductive line comprises copper and the conductive interconnects comprise tungsten.

4. The construction of claim 1 wherein the first dielectric spacers comprise a different composition than the second dielectric spacers.

5. The construction of claim 4 wherein the first dielectric spacers comprise one or both of silicon nitride and silicon dioxide; and wherein the second dielectric spacers comprise one or more of aluminum oxide, hafnium oxide, silicon oxide, zirconium oxide and silicon nitride.

6. The construction of claim 4 wherein the first dielectric spacers are a single homogenous material; and wherein the second dielectric spacers are a laminate of two or more different materials.

7. The construction of claim 4 wherein the first dielectric spacers are wider than the second dielectric spacers.

* * * * *

UNITED STATES PATENT AND TRADEMARK OFFICE
CERTIFICATE OF CORRECTION

PATENT NO.         : 9,679,852 B2
APPLICATION NO.    : 14/321466
DATED              : June 13, 2017
INVENTOR(S)        : Ashim Dutta, Mohd Kamran Akhtar and Shane J. Trapp It is certified that error appears in the above-identified patent and that said Letters Patent is hereby corrected as shown below:

In the Claims

Column 12, Line 34, Claim 1 – Replace "second regions the air gaps" with --second regions of air gaps--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*